United States Patent [19]

McArdle et al.

[11] Patent Number: 5,769,996
[45] Date of Patent: Jun. 23, 1998

[54] COMPOSITIONS AND METHODS FOR PROVIDING ANISOTROPIC CONDUCTIVE PATHWAYS AND BONDS BETWEEN TWO SETS OF CONDUCTORS

[75] Inventors: Ciaran Bernard McArdle; Joseph Burke, both of Dublin, Ireland

[73] Assignee: Loctite (Ireland) Limited, Dublin, Ireland

[21] Appl. No.: 464,733
[22] PCT Filed: Jan. 26, 1995
[86] PCT No.: PCT/IE95/00009
 § 371 Date: Jun. 29, 1995
 § 102(e) Date: Jun. 29, 1995
[87] PCT Pub. No.: WO95/20820
 PCT Pub. Date: Aug. 3, 1995

[30] Foreign Application Priority Data

Jan. 27, 1994 [IE] Ireland ..................................... 940077
Jan. 27, 1994 [IE] Ireland ..................................... 940078

[51] Int. Cl.⁶ .............................. B32B 31/20; H01F 1/44; H01R 4/04
[52] U.S. Cl. .................................... 156/272.4; 156/273.9; 156/275.7; 156/305; 252/62.51 R; 252/62.55; 252/500
[58] Field of Search ........................ 252/62.51 R, 62.55, 252/500, 510, 511, 512, 513; 156/272.4, 272.2, 273.9, 275.5, 275.7, 305; 427/128, 130, 547, 550, 598

[56] References Cited

U.S. PATENT DOCUMENTS

| | | | |
|---|---|---|---|
| 2,718,506 | 9/1955 | Elleman ................................... | 252/513 |
| 3,359,145 | 12/1967 | Salyer et al. ................................ | 156/1 |
| 3,580,776 | 5/1971 | Shenfil et al. ........................ | 156/272.4 |
| 3,661,744 | 5/1972 | Kehr et al. .......................... | 204/159.14 |
| 3,843,540 | 10/1974 | Reimers et al. ...................... | 252/62.52 |

(List continued on next page.)

FOREIGN PATENT DOCUMENTS

| | | | |
|---|---|---|---|
| 0208391 | 1/1987 | European Pat. Off. .......... | H01F 1/37 |
| 0232127 | 8/1987 | European Pat. Off. . | |
| 0299618 | 1/1989 | European Pat. Off. .......... | H01F 1/08 |
| 0330452 | 8/1989 | European Pat. Off. . | |
| 0402546 | 12/1990 | European Pat. Off. ......... | H05K 3/12 |
| 0549159 | 6/1993 | European Pat. Off. .......... | H01R 4/04 |

(List continued on next page.)

OTHER PUBLICATIONS

Berglund, R.N. et al., "Generation of Monodisperse Aerosol Standards", *Environmental Sci. and Tech.* 7(2) p. 147 1973.
Wu, H.F. et al., "Effect of Surfactant Treatments on Interfacial Adhesion in Single Graphite/Epoxy Composites", *Polymer Composites* 12(4), 281, 1993.

(List continued on next page.)

*Primary Examiner*—Curtis Mayes
*Attorney, Agent, or Firm*—Vidas, Arrett & Steinkraus

[57] ABSTRACT

The invention provides a composition comprising:
(i) a ferrofluid comprising a colloidal suspension of ferromagnetic particles in a non-magnetic carrier liquid, and
(ii) a plurality of electrically-conductive particles having substantially uniform sizes and shapes, dispersed in the ferrofluid.

Various types of substantially non-magnetic electrically-conductive particles are described. Application of a substantially uniform magnetic field by magnet means to the composition causes the electrically-conductive particles to form a regular pattern. The composition is used for providing anisotropic conductive pathways between two sets of conductors in the electronics industry.

The composition may be a curable adhesive composition which bonds the conductors. Alternatively or in addition the electrically-conductive particles may have a latent adhesive property e.g. the particles may be solder particles.

The ferrofluid may be a colloidal suspension of ferromagnetic particles in a liquid monomer.

40 Claims, 10 Drawing Sheets

U.S. PATENT DOCUMENTS

| | | | |
|---|---|---|---|
| 3,898,349 | 8/1975 | Kehr et al. | 427/36 |
| 3,917,538 | 11/1975 | Rosensweig | 252/62.51 |
| 4,008,341 | 2/1977 | Kehr | 427/44 |
| 4,092,376 | 5/1978 | Douek et al. | 260/884 |
| 4,100,088 | 7/1978 | Haas et al. | 252/62.52 |
| 4,170,677 | 10/1979 | Hutcheson | 428/119 |
| 4,215,209 | 7/1980 | Ray-Chaudhuri | 526/292 |
| 4,368,131 | 1/1983 | Rosenweig | 252/62.55 |
| 4,430,239 | 2/1984 | Wyman | 252/62.51 |
| 4,548,862 | 10/1985 | Hartman | 428/323 |
| 4,604,229 | 8/1986 | Raj et al. | 252/510 |
| 4,606,962 | 8/1986 | Reylek et al. | 156/272.2 X |
| 4,644,101 | 2/1987 | Jin et al. | 178/18 |
| 4,645,611 | 2/1987 | Campbell et al. | 252/62.51 |
| 4,687,596 | 8/1987 | Borduz et al. | 252/510 |
| 4,698,907 | 10/1987 | Soszek | 29/846 |
| 4,701,276 | 10/1987 | Wyman | 252/62.52 |
| 4,737,112 | 4/1988 | Jin et al. | 439/66 |
| 4,740,657 | 4/1988 | Tsukagoshi et al. | 174/88 R |
| 4,741,850 | 5/1988 | Wyman | 252/62.52 |
| 4,808,638 | 2/1989 | Steinkraus et al. | 522/24 |
| 4,846,988 | 7/1989 | Skjeltorp | 252/62.52 |
| 4,855,079 | 8/1989 | Wyman | 252/62.52 |
| 4,867,910 | 9/1989 | Meguro et al. | 252/519 |
| 4,935,147 | 6/1990 | Ullman et al. | 210/695 |
| 4,938,886 | 7/1990 | Lindsten et al. | 252/62.51 |
| 4,946,613 | 8/1990 | Ishikawa | 252/62.52 |
| 4,963,220 | 10/1990 | Bachmann | 156/307.3 |
| 4,965,007 | 10/1990 | Yudelson | 252/62.53 |
| 4,992,190 | 2/1991 | Shtarkman | 252/62.52 |
| 5,064,550 | 11/1991 | Wyman | 252/62.52 |
| 5,075,034 | 12/1991 | Wanthal | 252/511 |
| 5,076,950 | 12/1991 | Ullman et al. | 252/62.51 |
| 5,084,490 | 1/1992 | McArdle et al. | 522/181 |
| 5,085,789 | 2/1992 | Yokouchi et al. | 252/62.52 |
| 5,104,582 | 4/1992 | Lindsten | 252/62.51 R X |
| 5,124,060 | 6/1992 | Yokouchi et al. | 252/62.51 |
| 5,128,215 | 7/1992 | Pendergrass | 428/694 |
| 5,141,970 | 8/1992 | McArdle et al. | 522/170 |
| 5,147,573 | 9/1992 | Chagnon | 252/518 |
| 5,167,850 | 12/1992 | Shtarkman | 252/62.52 |
| 5,169,471 | 12/1992 | Strasser | 156/272.4 |
| 5,180,888 | 1/1993 | Sugiyama et al. | 174/94 |
| 5,221,417 | 6/1993 | Basavanhally | 156/629 |
| 5,346,558 | 9/1994 | Mathias | 148/23 |
| 5,349,478 | 9/1994 | Sato et al. | 360/55 |
| 5,366,140 | 11/1994 | Koskenmaki et al. | 228/246 |
| 5,382,373 | 1/1995 | Carlson et al. | 252/62.55 |
| 5,429,701 | 7/1995 | Lu | 156/272.4 |
| 5,438,223 | 8/1995 | Higashi et al. | 257/774 |
| 5,453,148 | 9/1995 | Lu et al. | 156/272.2 |
| 5,522,962 | 6/1996 | Koskenmaki et al. | 156/273.9 X |

FOREIGN PATENT DOCUMENTS

| | | |
|---|---|---|
| 940077 | 1/1994 | Ireland . |
| 940078 | 1/1994 | Ireland . |
| 950589 | 8/1995 | Ireland . |
| 62-127194 | 6/1987 | Japan . |
| 3-95298 | 4/1991 | Japan C10M 169/04 |
| 6-122857 | 5/1994 | Japan C09J 9/02 |
| 919502 | 2/1963 | United Kingdom . |
| 93/01248 | 1/1993 | WIPO . |
| 95/18476 | 7/1995 | WIPO . |

OTHER PUBLICATIONS

Holmberg, K., "Novel Surfactants for Paints", *Surface Coatings Int'l* (12) 481, 1993.

Skjeltorp, A.T., "Colloidal Crystals in Magnetic Fluid", *Conference on Magnetism & Magnetic Materials*, 163–164, Nov. 1983.

Soszek, "Two Novel Additive Processes to Create Circuitry: Direct Laser Writing and Direct Electrostatic Transfer Deposirtion", *Circuit World*, 19(4), 12–15, 1993.

Skeltorp A. T. et al., "Condensation and Ordering of Colloidal spheres Dispersed in a Ferrofluid", *Physica A* 176, 37, 1991.

Ferromagnetic Materials, Wohlfarth, E.P. ed., vol. 2, ch. 8, p. 509 Charles, S.W., Popplewell, J., Martinet A. Elsevier Sci. Publishing Co., 1983.

"Aggregation Processes in Solution",Wyn–Jones, E., Gormally, J. Ch. 18, p.509.

Shaw, "Chemistry and Technology of Epoxy Resins",B. Ellis ed., ch. 7 p.206, Blackie Academic and Professional, 1993.

Lyons & Dahringer, *Handbook of Adhesives Technology*, Pizzi & Mittal, eds., p.578, 1994.

Nakao Y., "Preparation and Characterization of Noble Metal Solid Sols in Poly(methly methacrylate)", *J. Chem. Soc. Chem. Commun.* 826, 1993.

Nakao Y. & Kaeriyama K., "Preparation of Noble Metal Sols in the Presence of Surfactants and thie Properties", *J. Colloid Interface Sci.* 110(1), 82, 1986.

Klabunde et al., "Colloidal Metal Particles Dispersed in Monomeric and Polymeric Styrene and Methyl Methacrylate", *Chemistry of Materials* 1, 481, 1989.

Cardenas T., G., "Synthesis and Molecular Weights of Metal (Styrene–Methyl Methacrylate) Copolymer. III", *Polymer Bull.* 27, 383, 1992.

Cardenas, G., "Synthesis and Molecular Weights of of Metal Polyacrylonitriles", *Polymer Bull.* 26, 611, 1991.

Rios P. et al., "Poly(butadiene–acrylic acid(g)acrylonitrile-(g)acrylic acid)", *Polymer Bull.* 31, 293–296, 1993.

Popplewell J. et al., "Microwave Properties of Ferrofluid Composites", *J. Magnetism and Magnetic Materials* 54–57, 761, 1986.

Kopcansky P., "The Observation of Various Structures of Magnetic Particles and Magnetic Holes in Ferrofluids", *Acta Phys. Slov.* 39(4), 259, 1989.

Hitachi Chemical Data Sheet, Specification of Anisolm AC 6073 (Date unknown).

ThreeBond Co. Brochure, ThreeBond 3370 Anisotropically Electroconductive Adhesive Film (Date unknown).

ThreeBond Co. Brochure, ThreeBond 3300 Series, *Conductive Resin, Adhesive, Paste and Coating Material* (Date unknown).

IBM Technical Disclosure Bulletin, 17(6), 1842–43, Nov. 1974.

Dyno Particles Brochure on polymer particles, Oct. 1991.

Author unknown, Fluid Has World's Highest Magnetic Flux Density, J. Electronic Engineering, 27 (280), 64–66, Apr. 1990.

Ferrofluidics Corporation Technology Note, Date Unknown.

Jianying Liu, The Swedish Institute of Production Engineering Research, IVF–Internal Report 91/04, *Applications of Anisotropically Conductive Adhesives and Films as Surface Mount Solder Joints Sutstitute—A Survey*, "How Does the Anisotropically Electrically Conductive Adhesives Work?", Feb. 18, 1991, pp. 32–36.

A. O. Ogunjimi et al., "A Review of the Impact of Conductive Adhesive Technology on Interconnection," *Journal of Electronics Manufacturing*, 1992, 2, pp. 109–118.

James O. Reilly et al., "Anisotropic Adhesive Progress Report," Apr. 5, 1993.

Peter B. Hogerton, "Development Goals and Present Status of 3M's Adhesive Interconnection Technology," *Journal of Electronics Manufacturing*, 1993, 3, pp. 191–197.

A. T. Skjeltorp, "Colloidal Crystals in Magnetic Fluid," *Journal of Applied Physics*, vol. 55, No. 6, Part IIB, pp. 2587–2588, 15 Mar. 1984.

David J. Williams et al., "The Effects of Conducting Particle Distribution on the Behaviour of Anisotropic Conducting Adhesives: Non–Uniform Conductivity and Shorting Between Connections," *Journal of Electronics Manufacturing*, 1993, 3, pp.85–94.

Sungho Jin et al., "Anisotropically Conductive Polymer Films with a Uniform Dispersion of Particles," *IEEE Transactions on Components, Hybrids, and Manufacturing Technology*, vol. 16, No. 8, Dec. 1993.

A. T. Skjeltorp, "Ordering phenomena of particles dispersed in magnetic fluids (invited)$^{a)}$," *J. Appli. Phys.*, 57(1), pp. 3285–3289 (1985).

A. T. Skjeltorp, "Monodisperse Particles and Ferrofluids: A Fruit–Fly Model System," *Journal of Magnetism and Magnetic Materials*, 65, pp. 195–203 (1987).

R. E. Rosensweig, "Magnet Fluids," *Ann. Rev. Fluid Mech.*, 19, pp. 437–463 (1987).

A. T. Skjeltrop, "One–and Two–Dimensional Crystallization of Magnetic Holes," Physical Review Letters, V.51(25), pp. 2306–2309, 19 Dec. 1983.

Derwent Abstract AN 86–261618 Aug. 23, 1986.

Derwent Abstract Secondary Accession C89–048416, Mar. 1, 1989.

Derwent Abstract 88–114223/17, Apr. 27, 1988, WPIL 211.

Derwent Abstract 88–113862/17, Apr. 27, 1988.

Derwent Abstract 87–032270/05, Dec. 18, 1986.

Derwent Abstract 87–018716/03, Dec. 8, 1986.

Derwent Abstract 87–018508/03, Dec. 6, 1986.

Derwent Abstract 87–196399/28, Jun. 9, 1987.

Derwent Abstract 86–314250/48, Oct. 15, 1986.

Derwent Abstract 68–97057P/00, Dec. 19, 1967.

Derwent Abstract 82–55954E/27, May 28, 1982.

COMPOSITIONS AND METHODS FOR PROVIDING ANISOTROPIC CONDUCTIVE PATHWAYS AND BONDS BETWEEN TWO SETS OF CONDUCTORS

TECHNICAL FIELD

This invention relates to compositions and methods for providing anisotropic conductive pathways between two sets of conductors, and to compositions and to methods for making anisotropically-conductive bonds between two conductors. The invention is particularly for use in the electronics industry.

BACKGROUND ART

Electronic components such as semiconductor chips are often very small and have minimal gaps between connectors such as pins. Conventional solder may give rise to difficulties because the solder may bridge the gap between two pins. Therefore anisotropically-conductive adhesives have been proposed for electrical interconnection. An anisotropically conductive adhesive (ACA) conducts electricity in one direction only (usually denoted as the Z direction) and should eliminate conduction in the plane perpendicular thereto (the X and Y directions).

Various proposals for ACA's are reviewed by Ogunjimi et al. in Journal of Electronics Manufacturing (1992) 2, 109–118. They usually consist of an adhesive matrix in which conductive particles are dispersed. The particles may be metal particles, or non-conductive particles (e.g. plastic or glass) with a thin metal coat. After the adhesive has been applied between two conductors, bond line thickness may then be reduced by pressure applied during cure so that the particles in the adhesive contact the two conductors but do not contact one another laterally (see U.S. Pat. No. 4,740,657 Tsukagoshi et al.). Alternatively, conductive particles which are also magnetic may be aligned by use of a magnetic field so that they form a chain and provide an anisotropically conductive path along the direction of the field. The adhesive is then cured while the field is applied (see U.S. Pat. Nos. 3,359,145 Salyer et al; 4,548,862 Hartman; 4,644,101 Jin et al; and 4,170,677 Hutcheson). U.S. Pat. No. 4,737,112 Jin et al. uses single-particle bridging with essentially uniform distribution resulting from application of a magnetic field. Particles are magnetized N-S by the magnetic field, resulting in lateral repulsion between particles. The text at column 4 lines 6–8 suggests that the particles may have a non-magnetic, non-conductive core portion which is coated with a magnetic conductive coating. However no working Examples of the use of such particles are described. The Examples in the Jin et al. patent use gold coated nickel spheres which would have a solid core of magnetic material.

In an unrelated area of technology, it is known to make a magnetic liquid or "ferrofluid" consisting of a colloidal suspension of minute ferromagnetic particles in an non-magnetic carrier liquid. A typical ferrofluid may consist of magnetite particles ($Fe_3O_4$) having a particle size in the range 2 nanometres to 0.1 micrometres (and a mean size of about 0.01 micrometres) in kerosene as carrier liquid with a surfactant to prevent agglomeration of the particles (see Skjeltorp "One- and Two-Dimensional Crystallization of Magnetic Holes" in Physical Review Letters, Volume 51, Number 25, 19 Dec. 1983, 2306–2309, the contents of which are incorporated by reference). Skjeltorp describes the production of "magnetic holes" inside a thin layer of magnetic fluid containing a monolayer of polydisperse polystyrene spheres with diameters in the micrometre range. U.S. Pat. No. 4,846,988 (Skjeltorp) describes a method for bringing bodies immersed in liquid to form regular structural patterns by dispersing non-magnetic, essentially monodisperse, particles having uniform sizes and shapes in a ferrofluid so that the particles create non-magnetic "holes" in the ferrofluid, and applying a substantially homogeneous magnetic field to the ferrofluid. Each of the dispersed non-magnetic particle bodies then assumes a magnetic moment corresponding to the volume of liquid displaced by the body, but inversely directed. Magnetic interaction forces then prevail between the particle bodies, which may thus be collectively controlled by the external magnetic field to assume structural patterns. When the particle bodies are relatively large (greater than or equal to 5 micrometres) compared to the size of the magnetite particles (of the order of 0.01 micrometres) within the ferrofluid, they undergo negligible Brownian motion. However when the particles are smaller than about one micrometre, Brownian motion introduces fluctuations into the system which can prevent the build up of very long chains and cause chain pieces to reptate (Skjeltrop A. T. and Helgesen, G. Phyisica A, 176, 37, 1991; Skjeltrop A. T. J. Appl. Physics 57(1), 3285, 1985). Nevertheless with small particle body inclusions it is still possible to develop longer and stiffer chains by increasing the magnetic field. The utility of Skjeltrop's invention in U.S. Pat. No. 4,846,988 is to form patterns which may influence electromagnetic and acoustic waves, simulate states and processes in atomic or molecular structures and the like. Skjeltorp states that the non-magnetic particle bodies are mondisperse bodies (i.e. a great number of bodies have essentially identical size and form) and are preferably made of plastic material, in particular polystyrene. There is no suggestion of using electrically conductive particle bodies.

Neither is there a suggestion that pure noble metal colloids, with particle sizes comparable to those of the magnetic material itself, can be used to form anisotropic structural patterns made up of metallic pathways by first using magnetic field induced aggregation of the noble metal and second aligning said aggregates. It is known, for example, that gold and other noble metals can be made in colloidal form in an aqueous or non-aqueous state (Nakao Y., J Chem Soc Chem Commun., 826, 1993; Nakao, Y. and Kaeriyama K., J. Colloid Interface Sci., 110(1), 82, 1986), and that colloidal metal particles may be dispersed in polymerisable systems such as acrylics, styrenes and acrylonitrile (Cardenas-Trivino G. et al., Chemistry of Materials, 1, 481, 1989, Polymer Bulletin 27, 383, 1992, Polymer Bulletin 26, 611, 1991, Polymer Bulletin 31, 23, 1993; Nakao et al. loc cit.). Still further, it is known to be possible to produce so-called ferrofluid composites, which differ from stable co-colloidal systems but none the less comprise minute metallic components which align in response to a magnetic field (Popplewell, J. et al. J.Magnetism & Magnetic Materials, 54–57, 761, 1986; see also Kopcansky, P., et al. Acta Phys Slov. 39(4), 259, 1989). The latter systems have been proposed as possible polarisers or attenuators for microwave (3 mm wavelength range) radiation. There has been no suggestion in the literature that such systems could be rendered permanent following the removal of the magnetic field. The possibility that co-colloidal systems could undergo magnetic field induced phase separation followed by alignment of metal aggregates in structural patterns which can be subsequently locked permanently in position and be used as an anisotropically conductive adhesive, has not been suggested.

U.S. Pat. No. 5,075,034 Wanthal describes a two component adhesive composition which is curable by induction heating (i.e. with an induced magnetic field) and which contains conductive carbon black along with iron oxide particles. However there is no suggestion that the iron oxide particles may be of such small particle size as to form a colloidal suspension. This patent therefore does not relate to the field of ferrofluids or of anisotropically conductive adhesives.

In a further unrelated area of technology, U.S. Pat. No. 4,946,613 Ishikawa describes a photosetting ferrofluid for use in magnetic flaw detection or for visualising magnetically recorded patterns. The photosetting ferrofluid comprises a carrier, a ferrofluid in which the ferromagnetic particles have an adsorbed surfactant (or the surfactant is dispersed in the carrier) and a photosetting resin. The photosetting resin may be the carrier. The ferrofluid is applied to a surface to be analysed and is then subjected to a magnetic field. The applied ferrofluid will be attracted to the portion where the magnetic flux leaks i.e. to cracks or defects in the surface, and will swell to form a pattern corresponding to the configuration of the defect portion. A beam of light is then used to set or harden the photosetting resin so as to fix the defect pattern thus formed.

Ishikawa does not envisage the application of a magnetic field to create a chosen alignment of particles, followed by fixation of this alignment.

ACA's rendered anisotropic by application of a magnetic field have not been adopted commercially, so far as the present Applicants are aware. The prior art proposals (e.g. as in U.S. Pat. Nos. 4,548,862 and 4,644,101) require specialised magnetic particles which are electrically conductive. Such particles are expensive and difficult to obtain.

In addition, magnetic particles which have been aligned by a magnetic field are likely to be randomly distributed when viewed in a plane transverse to the alignment. This is undesirable for interconnection in the electronics field, where the distribution of conductive pathways is critical in order to ensure conduction between each opposed pair of conductors.

DISCLOSURE OF INVENTION

It is an object of the present invention to provide a composition and method for creating anisotropic conductive pathways utilising electrically-conductive particles which are readily available or which can be readily made.

It is a further object of the invention to provide a composition and a method which will create a regular structured pattern of anisotropic conductive pathways.

It is a further object of one aspect of the invention to provide an ACA composition and a method for creating anisotropic conductive pathways and bonding two sets of conductors.

It is a further object of the invention to provide an ACA in which conductive elements and insulating elements are in mutually exclusive zones.

The present invention provides a composition comprising:
(i) a ferrofluid comprising a colloidal suspension of ferromagnetic particles in a non-magnetic carrier liquid, and
(ii) a plurality of electrically-conductive particles having substantially uniform sizes and shapes, dispersed in the ferrofluid.

The present invention further provides a method of providing anisotropic conductive pathways between two sets of conductors which comprises forming said pathways with a plurality of electrically-conductive particles having substantially uniform sizes and shapes, said electrically-conductive particles having been arrayed in a regular pattern by application of a substantially uniform magnetic field to a composition as defined in the preceding paragraph.

Preferably the average particle size of the electrically-conductive particles is at least 10 times that of the colloidal-size ferromagnetic particles, more particularly at least 100 times, most preferably at least 500 times. Most suitably the electrically-conductive particles have an average particle size (measured on the minor dimension in the case of non-symmetrical particles) of at least 2 micrometres while the colloidal ferromagnetic particles have an average particle size not greater than 0.1 micrometres, more preferably of the order of 0.01 micrometres.

In the preferred embodiments, the electrically-conductive particles are arrayed in a regular pattern in a monolayer and/or in columns.

The electrically-conductive particles are optionally latently adhesive.

Advantageously, the separation between the respective sets of conductors is substantially equal to or less than the average diameter of the electrically-conductive particles.

According to one aspect, the present invention provides a curable composition comprising:
(i) a curable ferrofluid composition, the ferrofluid comprising a colloidal suspension of ferromagnetic particles in a non-magnetic carrier liquid, and
(ii) a plurality of electrically-conductive particles having substantially uniform sizes and shapes, dispersed in the composition.

The term "curable ferrofluid composition" used herein includes:
(1) a dispersion of colloidal magnetic particles in a curable liquid composition (i.e the curable liquid composition acts as the carrier of the ferrofluid), and
(2) a mixture of a non-inventive curable composition and a dispersion of colloidal magnetic particles in a curable, or non-curable liquid carrier.

The invention in its first aspect further provides a method of forming anisotropic conductive pathways in a cured composition which comprises:
(a) applying a substantially uniform magnetic field to a curable composition comprising:
(i) a curable ferrofluid composition, and
(ii) a plurality of electrically-conductive particles having substantially uniform sizes and shapes dispersed in the composition,
such that interaction between the ferrofluid and the electrically-conductive particles causes the electrically-conductive particles to form a regular pattern of particles; and
(b) curing the composition to lock the pattern in position.

The invention in its first aspect also provides a method of making an anisotropically-conductive bond between two sets of conductors, comprising:
(a) applying to one set of conductors a layer of an adhesive composition comprising:
(i) a curable ferrofluid adhesive composition, and
(ii) a plurality of electrically-conductive particles having substantially uniform sizes and shapes dispersed in the composition;
(b) bringing a second set of conductors against the layer of adhesive composition;
(c) exposing the layer of adhesive composition to a substantially uniform magnetic field such that interaction between the ferrofluid and the electrically-conductive particles causes the electrically-conductive particles to form a regular pattern of particles each in electrical contact with an adjacent particle and/or with a conductor of one or both sets whereby conductive pathways are provided from one set of conductors to the other set, each pathway comprising one or more of the electrically-conductive particles; and (d) curing the composition to lock the pattern in position and to bond the conductors.

Preferably in the above-described methods the composition is cured while the magnetic field is applied.

In its second aspect, the present invention provides a composition for making an anistropically conductive bond between two sets of conductors, comprising (i) a ferrofluid comprising a colloidal suspension of ferromagnetic particles in a non-magnetic carrier liquid or a mixture of a ferrofluid comprising a colloidal suspension of ferromagnetic particles in a non-magnetic carrier liquid and a curable liquid composition, and (ii) a plurality of electrically-conductive particles having substantially uniform sizes and shapes, dispersed in the ferrofluid, the particles having a latent adhesive property.

The invention in its second aspect also provides a method of making an anisotropically-conductive bond between two sets of conductors, comprising:

(a) applying to one set of conductors a layer of a composition comprising:

(i) a ferrofluid, and (ii) a plurality of electrically-conductive particles having substantially uniform sizes and shapes dispersed in the ferrofluid, the particles having a latent adhesive property;

(b) bringing a second set of conductors against the layer of the composition;

(c) exposing the layer of the composition to a substantially uniform magnetic field such that interaction between the ferrofluid and the electrically-conductive particles causes the electrically-conductive particles to form a regular pattern of particles each in contact with an adjacent particle and/or with a conductor of one or both sets; and (d) activating the latent adhesive property of the particles whereby conductive pathways are provided from one set of conductors to the other set, each pathway comprising one or more of the electrically-conductive particles, and the conductors are bonded by the particles.

The latent adhesive property may, if desired, be activated while the magnetic field is applied. The latent adhesive property of the conductive particles is preferably activated by heat. The conductive particles may suitably comprise a fusible metal, particularly solder particles of an electroconductive metal alloy. Alternatively the conductive particles may suitably comprise particles which are of conductive material or which have a conductive coating thereon, and which bear an outer coating of an adhesive which is activatable, e.g. by heat or pressure.

Suitable heat-activated adhesives include both hot melt and reactive hot melt types. Other suitable adhesives include both pressure-sensitive adhesives and compositions containing a microencapsulated ingredient such as a catalyst which can be activated by pressure. The adhesive-coated conductive particles should be dry to touch. When the adhesive is activated it should flow sufficiently at points of contact between the particles to allow the electrically-conductive surfaces of particles to come into contact with adjacent particles and/or conductors (see U.S. Pat. No. 5,180,888 Sugiyama et al.).

When the latent adhesive is activated, the particles in contact with a conductor are bonded thereto while two particles which are in mutual contact become bonded together. Thus a bond is made between two sets of conductors through a regular pattern of conductive particles which themselves are inherently capable of creating the bond. After bonding, the ferrofluid which has served its purpose of causing the conductive particles to adopt a regular pattern may be removed or may be left in place. If desired the bond may be supplemented by a conventional non-conductive adhesive composition before or after removal of the ferrofluid. Alternatively the space vacated by the ferrofluid may be filled with a conventional curable insulating material.

In a preferred feature of the invention, pressure is applied to urge the respective sets of conductors towards one another before and/or during the curing step or the activation of the latent adhesive property. Those skilled in the art will recognise that in some applications the use of pressure would be required in order to ensure electrical contact between the substrate conductors and the electrically-conductive particles e.g. where the substrates are undulating or uneven. However when the layer of the composition is of sufficient thickness to allow chain formation by two or more particles in the Z-axis direction (see Example 2 below) contact may be achieved without the use of pressure.

According to another preferred feature of the present invention, the separation between the respective sets of conductors is substantially equal to the average diameter of the electrically-conductive particles. During exposure to the magnetic field, the separation may suitably be slightly greater than the average diameter of the electrically-conductive particles, so that each particle is surrounded by the carrier liquid and is free to move in the layer of the composition. After the particles have been ordered by the magnetic field, pressure is applied to urge the conductors towards one another so that contact is ensured between the conductors and the electrically-conductive particles. If the particles are compressible, the separation between the respective sets of conductors may be reduced to less than the average diameter of the electrically-conductive particles so that the particles between the conductors are compressed into a non-circular cross-sectional shape and the area of electrical contact between the surface of each particle and the conductors is increased. Compression of individual particles to different degrees of compression may also compensate for undulations or unevenness in the surface of the conductors. Electrically-conductive particles having a core of polymeric material coated with an electrically-conductive metal will have a degree of compressibility dependent upon the extent of cross-linking of the polymer. Gold-coated spherical polystyrene particles supplied by Sekisui Fine Chemical Co, Osaka, Japan under the name AU 212, (which were found to have an average diameter of 11.5 micrometres) compressed on the Z-axis under 3.3 MPa pressure were found to have a Z-axis dimension of 10.5 micrometres i.e. an aspect ratio (Z/X) of 0.79 corresponding to an 8.7% contraction on the Z-axis.

In one embodiment, the magnetic field is applied normal to the layer of the composition (i.e. in the Z direction) and the electrically-conductive particles form a regular array of particles in a monolayer or in columns, depending on the thickness of the layer. With a monolayer there is primarily single-particle bridging in the Z direction between the sets of conductors. The regular pattern improves the reliability of electrical contact. In a second embodiment the magnetic field is applied parallel to the layer of the composition (i.e. the X direction) and the electrically-conductive particles form parallel chains of particles, each in electrical contact with an adjacent particle or particles of the same chain. The chains are formed to lie parallel to the longitudinal axis of two sets of conductor pins or tracks. Here again, single-particle bridging in the Z-direction is achieved between the two sets of conductors but the particles are also in electrical contact with adjacent particles in the same chain so that reliability is further improved. In a case where two separate sets of conductor pins or tracks are located on opposite edges of an integrated circuit or other component, the layer of the composition will normally be interrupted at a central area of the component so that no conductive chain of particles extends across the width of the component to connect the two sets of conductors on the same component (unless in a special case this is desired). In the case of a "quad" component having conductor pins on four edges, with two sets at right angles to the other two sets, the layer of the composition is applied, exposed to the magnetic field and cured or activated in two steps, so that chains of conductive particles are formed in the X-direction and Y-direction with the appropriate alignments in the respective areas.

With the embodiment which uses a magnetic field normal to the layer of the composition, no significant alignment in the X-direction or Y-direction occurs, so that no interruption of the layer of the composition or double alignment step is needed.

The layer of the composition may suitably be applied to one component, e.g. a printed circuit board, by screen printing onto the sets of conductors on that component, after which the second component, e.g. an integrated circuit is brought against the composition with its set of conductors aligned with those on the first component.

In the event that there are excursions from planarity in either the tracked substrate or in the level of each of the pin-outs (conductors) on the component to be bonded, the present invention allows for the formation of columns of conductive particles greater than one particle tall and this therefore offers the advantage of self adjustment with regard to bridging irregular gaps between substrates which require conductivity in the direction normal to the substrate plane.

The colloidal ferro-magnetic particles of the ferrofluid are preferably magnetite but other ferromagnetic particles may also be used as described in U.S. Pat. No. 4,946,613 Ishikawa the contents of which are incorporated herein by reference. Exemplary ferromagnetic particles include: (i) ferromagnetic oxides such as manganese ferrites other than magnetite, cobalt ferrites, barium ferrites, metallic composite ferrites (preferably selected from zinc, nickel and mixtures thereof), and mixtures thereof; and (ii) ferromagnetic metals selected from iron, cobalt, rare earth metals and mixtures thereof. The particle diameter may be in the range 2 nanometres to 0.1 micrometres, preferably with a mean particle size of about 0.01 micrometres. The ferromagnetic particle content may suitably comprise from 1 to 30% by volume of the curable ferrofluid adhesive composition. In the case where a monomer forms the carrier of the ferrofluid, the suspension of ferromagnetic particles in the monomer may suitably have a particle content of 2–10% by volume.

A surfactant will generally be required for stably dispersing the ferro-magnetic particles in the carrier. Surfactants may be selected from unsaturated fatty acids and salts thereof wherein the fatty acid or salt has one or more polar groups such as COOH, $SO_3H$, $PO_3H$ and mixtures thereof, or other surfactants well known in the art such as silicone type surfactants, fluorine type surfactants and the like. Suitable surfactants include Sodium oleate, or oleic acid, silane coupling agents such as that available under the Trade Mark SH-6040 from Toray Silicone Co. Ltd., Saloosinate LH from Nikko Chem. Co. Ltd, the fluorine containing surfactant X C95-470 from Toshiba Silicone Co. Ltd.. Primary surfactants form an adsorbed coating on the surface of the ferro-magnetic particles. In some circumstances a secondary surfactant may also be required, to achieve satisfactory dispersion, particularly an anionic surfactant, for example an acid form of a phosphate ester, particularly an aromatic phosphate ester type surfactant such as GAFAC RE610 from GAF (Great Britain) Limited, Wythenshawe, Manchester, U.K. or RHODAFAC RE610 from Rhone-Poulenc Chimie, France.

A suitable non-magnetic carrier liquid may be chosen from among those described in U.S. Pat. No. 4,946,613 Ishikawa or U.S. Pat. No. 3,843,540 Reimers the contents of which are incorporated herein by reference. The carrier may suitably be an organic soluent selected from (a) hydrocarbons such as liquid fractions of intermediate boiling range such as kerosene and fuel oils, n-pentane, cyclohexane, petroleum ether, petroleum benzine, benzene, xylene, toluene and mixtures thereof; (b) halogenated hydrocarbons such as chlorobenzene, dichlorobenzene, bromobenzene and mixtures thereof; (c) alcohols such as methanol, ethanol, n-propanol, n-butanol, isobutanol, benzylalcohol and mixtures thereof; (d) ethers such as diethyl ether, diisopropyl ether and mixtures thereof; (e) aldehydes such as furfural and mixtures thereof; (f) ketones such as acetone, ethyl methyl ketone and mixtures thereof; (g) fatty acid such as acetic acid, acetic anhydride and mixtures thereof and derivatives thereof; and (h) phenols, as well as mixtures of the various solvents.

Reviews on ferrofluids have been provided by various authors (Ferromagnetic Materials, Wohlfarth E. P. (Ed), Vol 2 Chpt 8, p509-Charles S. W. and Popplewell J., North Holland Publishing Co. 1980; Aggregation Processes in Solution, Wyn-Jones E., Gormally, J. Chpt 18, p509, Martinet A Elsevier Sci. Publishing Co. 1983; Rosensweig R. E. Ann. Rev. Fluid Mech. 19, 437–463, 1987). Commercially available ferrofluids such as those from Ferrofluidics Corp. N.H., USA comprise dispersed magnetisable particles in suitable carriers, the most common of which are water, esters, flurocarbons, polyphenylethers and hydrocarbons. A typical commercially available ferrofluid such as APG 511A (cited in the examples below) comprises 3–8% by volume magnetite, 18–30% by volume oil soluble dispersant, 60–78% by volume synthetic esters and 1–2% by volume amine. Typical properties and applications of ferrofluids are detailed below:

| TYPICAL PROPERTIES OF STANDARD FERROFLUIDS (25° C. unless noted) | | | |
|---|---|---|---|
| | Carrier Type | | |
| Ferrofluid Property | Light Mineral Oil | Water | Low Vapor Pressure Synthetic Oils |
| Magnetic Saturation, (in Gauss) | 100–900 | 100–400 | 100–600 |
| Density, (gm/ml) | 0.9–1.39 | 1.1–1.2 | 1.05–1.66 |
| Viscosity @ 27° C. (mPa s) | 3–45 | 2–50 | 20–6,000 |
| Vapour Pressure @ 100° C., (torr) | 7.2 | 760 | $10^{-4}$ to $10^{-9}$ |
| Surface Tension (dynes/cm) | 25–27 | 33–48 | 25–28 |

-continued

TYPICAL PROPERTIES OF STANDARD FERROFLUIDS (25° C. unless noted)

| Ferrofluid Property | Carrier Type | | |
| --- | --- | --- | --- |
| | Light Mineral Oil | Water | Low Vapor Pressure Synthetic Oils |
| Initial susceptibility* | 0.5–5.0 | 0.5–2.2 | 0.5–5.0 |
| Thermal Conductivity, (MW/M °K.) | 170 | 160–260 | 94–170 |
| Electrical Resistivity (Ohm – Cm) | $1.5 \times 10^9$ | $5 \times 10^3$ | $1.5 \times 10^9$ |
| Evaporation Rate @ 240° C. ($gm/cm^2$ – sec) | — | — | $1.4$–$3.7 \times 10^6$ |

*Initial susceptibility is a function of both the saturation magnetization of the fluid and the strength of the applied magnetic field.

Further characteristics of a ferrofluid are given in Example 1, Table 1.

The ferrofluids are effective insulators. The resistivity of a ferrofluid adhesive composition is likely to be further increased after curing.

The curable composition in the first aspect of the invention may be a sealant or potting composition but is preferably an adhesive composition and may be any suitable monomer composition into which the ferrofluid can be mixed or in which the colloidal magnetic particles can be dispersed. Numerous polymerisable systems based on acrylate, epoxide, siloxane, styryloxy, vinyl ether and other monomers, oligomers, prepolymers and/or polymers and hybrids thereof may be used. The adhesive may be selected from olefinically unsaturated systems such as acrylates, methacrylates, styrene, maleate esters, fumarate esters, unsaturated polyester resins, alkyd resins, thiol-ene compositions, and acrylate, methacrylate, or vinyl terminated resins including silicones and urethanes. Suitable acrylates and methacrylates are those used in polymerisable systems such as disclosed in U.S. Pat. No. 4,963,220 of Bachmann et al. and U.S. Pat. No. 4,215,209 of Ray-Chaudhuri et al. . . . Particularly preferred are hydroxyl-containing methacrylates especially hydroxyalkyl methacrylates such as hydroxypropyl methacrylate. Also preferred are methylmethacrylate, polyfunctional methylacrylates, silicone diacrylates and polyfunctional acrylated urethanes of the type known to be useful in formulating adhesives (e.g. as disclosed in U.S. Pat. No. 4,092,376 of Douek et al) or a thiol-ene (e.g. as disclosed in U.S. Pat. Nos. 3,661,744, 3,898,349, 4,008,341 or 4,808, 638). Suitable epoxy systems are included among those described in "Chemistry and Technology of Epoxy Resins", ed. B. Ellis, Blackie Academic and Professional, 1993, London, Chapter 7 P.206ff. F. T. Shaw. Suitable Styryloxy systems are as disclosed in U.S. Pat. Nos. 5,543,397, 5,084, 490 and 5,141,970. The contents of all the above-mentioned patents and text are incorporated herein by reference. One proviso applied to the adhesive system is that it is either compatible with the commercially available ferrofluids or else is capable of acting as a carrier for the suitably treated magnetically polarisable particles which are used in the making of a ferrofluid. The adhesive composition may be curable by free radical, anaerobic, photoactivated, air-activated, heat-activated, moisture-activated, instant or other cure systems.

The electrically-conductive particles may be magnetic; although the magnetic field will be applied directly to such particles, the presence of the ferrofluid contributes to a more structured pattern of aligned magnetic electrically-conductive particles than would be achieved if the particles were dispersed in a composition without the ferrofluid.

However it is a preferred feature of the present invention that the electrically-conductive particles should be substantially non-magnetic.

The term "non-magnetic" as used herein means that each particle has no significant net magnetic dipole. A particle with a non-magnetic core may have a coating of a metal (such as nickel) which is ferromagnetic in nature but in view of the small volume of the coating the net magnetic moment per unit volume of the particles is not significant. The sustantially non-magnetic particles do not respond to magnetic fields in environments which themselves are not susceptible to magnetic fields, for example a non-ferromagnetic medium.

The electrically-conductive particles may suitably have a size in the range 1–300 micrometres. Spherical particles are preferred but other spheroidal shapes, elongated shapes or fibrous structures may also be used. For spherical particles a diameter in the range 2–100 micrometres, more particularly 2–50 micrometres, is preferred, while for particles having a major dimension and a minor dimension the major dimension is preferably in the range 2–300 micrometres and the minor dimension is preferably in the range 2–100 micrometres, particularly 2–50 micrometres, the aspect ratio preferably being in the range 15/1 to 1/1, more preferably 10/1 to 1/1. In the case of fibrous structures an aspect ratio of up to 50/1 may be acceptable but fibres are less preferred because of the danger of cross-contact causing incorrect interconnection between conductors, particularly in a thin layer of composition. Suitable particles may have a non-magnetic non-conductive core, for example of plastics material such as polystyrene, or of glass, coated with an electrically-conductive metal such as nickel, silver or gold. A core of conductive material such as graphite or a metal may be used. The core may optionally be hollow. Particles cf carbon fibre or solder may also be used.

Alternatively the electrically-conductive particles may be colloidal, with a particle size in the same range as the ferromagnetic particles of the ferrofluid, so that a co-colloidal system is formed.

The electrically-conductive particles form electrically-conducting inclusions in the ferrofluid composition which is an insulator. Application of a magnetic field to the ferrofluid composition causes interactions between the colloidal ferromagnetic particles and the non-magnetic conductive particles so that they are mutually stabilized in a regular structural pattern (with chain formation where the appropriate dimension of a layer of the composition so permits) due to attractive interactions between particles and repulsive interaction between chains. In effect there is a driving force to move the conductive elements relative to the insulating elements so that the two systems are in mutually exclusive zones (see Skjeltorp, Physical Review Letters, Op.cit.).

The concentration of electrically-conductive particles in the composition is chosen according to the desired spacing between those particles in the ordered array and other factors. With spherical particles of about 2 micrometres diameter, a concentration in a monolayer of $10^7$ particles per square centimetre may be suitable. A qualitative concentration in the range 0.5–60%, by weight of the composition may also be suitable.

Optimum concentrations of conductive particles depend upon a number of factors that can be determined by those skilled in the art through simple experimentation and/or mathematical calculations.

Skjeltorp (U.S. Pat. No. 4,846,988) notes that the concentration of magnetic holes in ferrofluids polarised with a magnetic field, determines the distance between them. Shiozawa et al. (1st International Conference on Adhesive Joining Technology in Electronics Manufacturing, Berlin, November 1994) indicates that contact resistance in traditional anisotropically conductive adhesives decreases as particle count (per unit area) increases. The larger the number of conductive particles, the greater the current carrying capacity. The current carrying capabilities are not only concentration dependent but also particle type dependent (Lyons and Dahringer in "Handbook of Adhesives Technology, Pizzi and Mittal (eds), Marcel Dekker Inc 1994, p.578).

Thus the actual concentration of conductive particles will depend on the particle type, density, diameter, electrical pattern, minimum required contact resistance measurements, the spacing between opposing and adjacent conductors, the surface area of the conductors, etc.

Li and Morris (1st International Conference on Adhesive Joining Technology in Electronics Manufacturing, Berlin, November 1994) have developed computer programs that calculate the minimum pad size for different loading densities and the minimum pad space for different particle sizes of conductive particles in conductive adhesives.

The magnetic field may be applied by a permanent magnet or by electromagnetic means.

BRIEF DESCRIPTION OF DRAWINGS

Preparatory work and embodiments of the invention will now be described by way of example. Certain examples are supported by figures (photo micrographs). In the figures.

MODES FOR CARRYING OUT THE INVENTION

Figure 1:
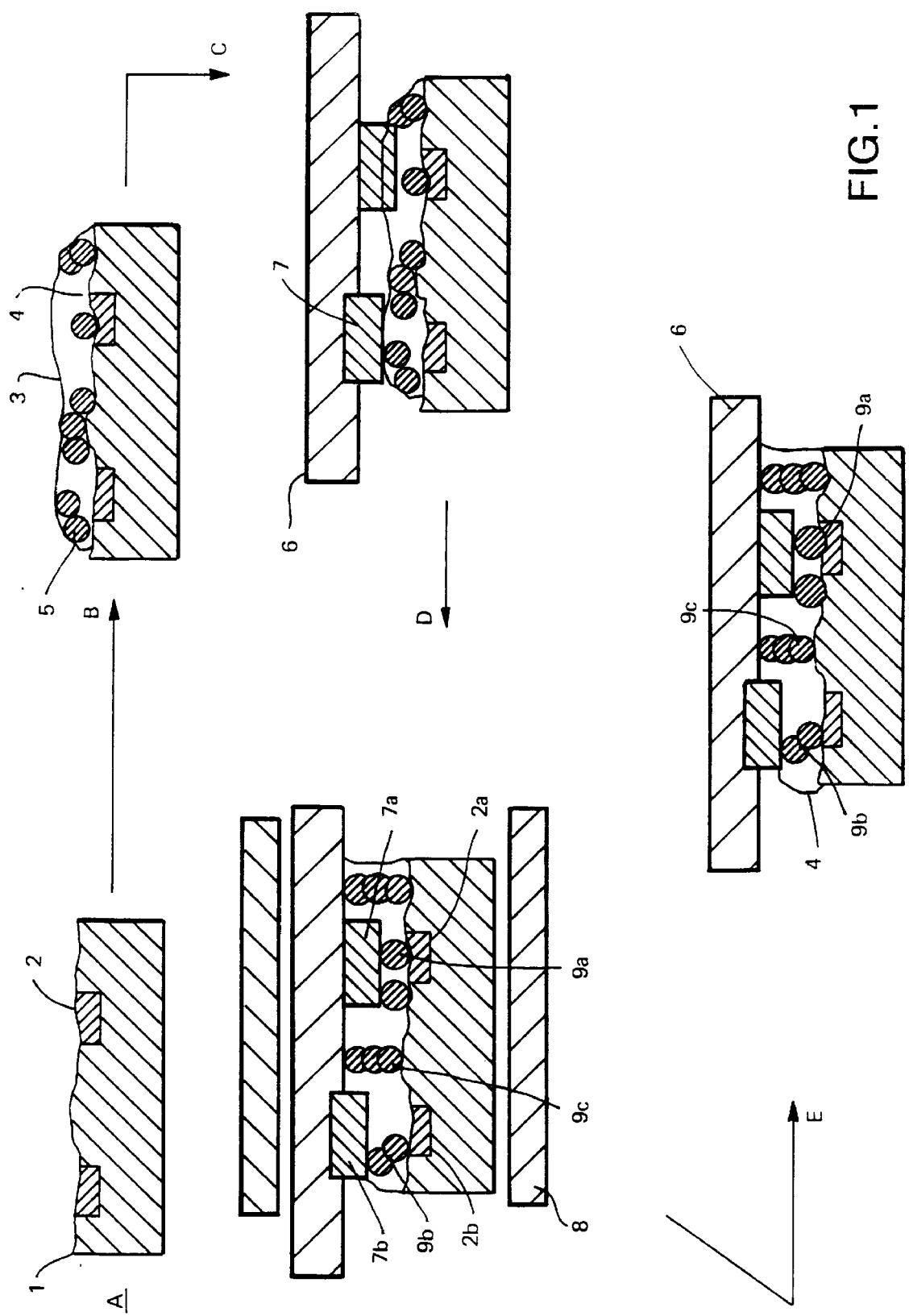
FIG. 1 is a diagram showing the bonding method of the first aspect of the invention.

FIG. 1 is a diagram showing one example of the bonding method in the first aspect of the invention through stages A to E. Dimensions are exaggerated in the diagram for clarity. The electrically-conductive particles are spherical and have a substantially uniform diameter.

(A) A circuit board 1 has metallised tracks or pads 2 thereon.

(B) A layer of composition 3 is applied thereto, the composition comprising curable ferrofluid adhesive composition 4 and conductive particles 5 distributed randomly therein.

(C) An electronic component 6 having conductor pins 7 thereon is laid against the composition 3. Pressure may be applied to urge the component 6 towards the circuit board 1. The conductor pins 7 as shown are at different levels relative to one another and to the surface of the component 3.

(D) A magnetic field is then applied to the assembly perpendicular to the circuit board 1 and component 6, by magnet means 8. As a result of interaction between the ferrofluid and the conductive particles 5, the latter lose their random disposition and move to form a regular pattern of aligned particles 9, as individual particles in a monolayer 9a or in columns 9b and 9c, the individual particles and columns being generally regularly spaced in both X- and Y-directions so that they form an array in a plane perpendicular to the magnetic field. Irregularities in separation between the tracks 2 and pins 7 are filled by aligned particles in contact with one another, forming a column 9b. Particles in the monolayer 9a or at each end of columns 9b are in contact with tracks 2a, 2b and pins 7a, 7b respectively. Other columns 9c, which do not make contact at both ends, do not provide conductive pathways between the tracks 2 and pins 7. There is no pathway for conduction in the X- or Y-direction.

If the circuit board 1 and electronic component 6 both had level surfaces and were brought to a separation substantially equal to the diameter of a conductive particle 5, all of the pathways could be provided by single-bridging particles 9a as individual particles in a monolayer or in chains parallel to the tracks 2, each chain consisting of particles contacting one another in the X direction.

(E) After curing of the adhesive composition the magnetic field is removed leaving the array of particles 9a, 9b to form the conductive pathways.

Figure 2:
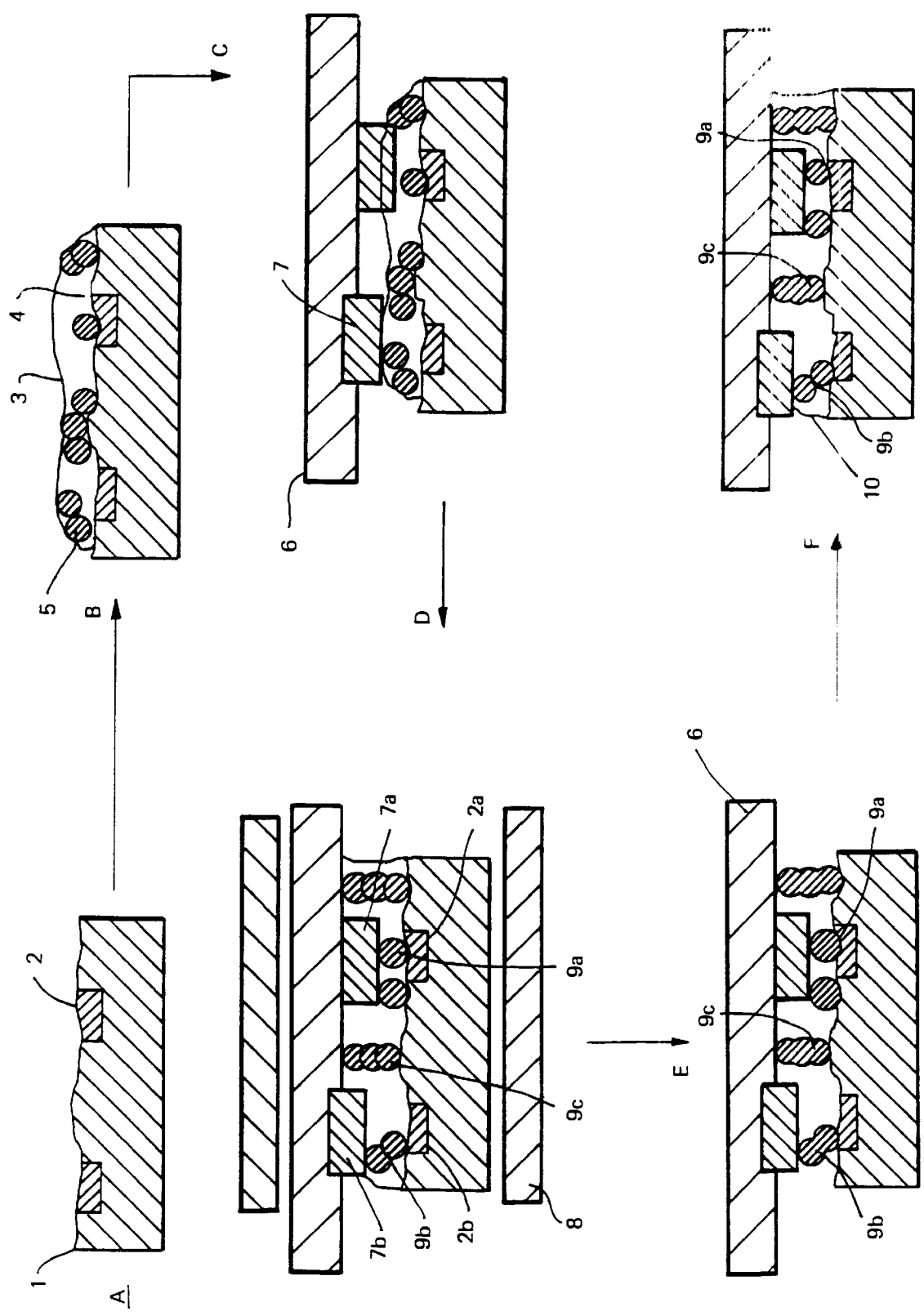
FIG. 2 is a diagram showing the bonding method of the second aspect of the invention.

FIG. 2 is a similar diagram showing the bonding method in the second aspect of the invention. Reference numerals in FIG. 2 correspond to those in FIG. 1 except that the matrix 4a is a ferrofluid which does not incorporate adhesive and particles 5 have a latent-adhesive property. At stage E, the latent adhesive property of the particles 5 is activated (e.g. by heating solder particles to melting point) either before or after the magnetic field is removed. The ferrofluid 4a may also be removed. The individual particles 9a and columns 9b, 9c of particles bond the assembly together while the particles 9a and columns 9b form the conductive pathways.

Stage F illustrates that after removal of the ferrofluid 4a, a conventional adhesive, sealant or potting composition 10 may optionally be added into and/or over the bond between the components in order to enhance the bond and/or to protect the electrical connection from adverse environmental factors.

EXAMPLE 1

Ferrofluid with non-magnetic particles

The ordering of non-magnetic particles in a ferrofluid was first examined in accordance with the following experiment. A kerosene-based ferrofluid known as APG 511A was purchased from Advanced Products and Technologies Ltd., (Oxford, U.K.) which is a subsidiary of Ferrofluidics Corp., Nashua, N.H., USA. The characteristics of the fluid are indicated in Table 1.

TABLE 1

| Characteristics of ferrofluid APG 511A | |
|---|---|
| Saturation Magnetisation (Gauss) | 200 |
| Magnetic field required to achieve 90% of saturation magnetisation (Oe) | 2500 |
| Initial magnetic permeability (30 Oe) | 1.9 |
| Magnetic permeability at 8000 Oe | 1.02 |
| the above values measured at 25° C. | |
| Viscosity at 27° C. (mPa s) | 40 |
| Pour point (C.) | −70 |
| Density at 25° C. (gm/ml) | 1.12 |
| Thermal Conductivity at 38° C. (mW/m K.) | 146 |
| Evaporation rate at 175° C. ($\times 10^{-7}$ gm/cm$^2$ – sec) | 7.6 |

To this fluid was added a qualitative concentration of monodisperse polymer beads (<0.5% w/w). The polymer beads were composed of polystyrene crosslinked to an extent of 55% with divinyl benzene (PS-DVB 55%). The beads coded Q496 were purchased from Dyno Particles AS, Lillestrom, Norway and had a mean diameter of 9.8 micrometres as measured with a Coulter (Trade Mark) LS Particles Size Analysis apparatus operating in the Fraunhofer optical mode.

Figure 3A:
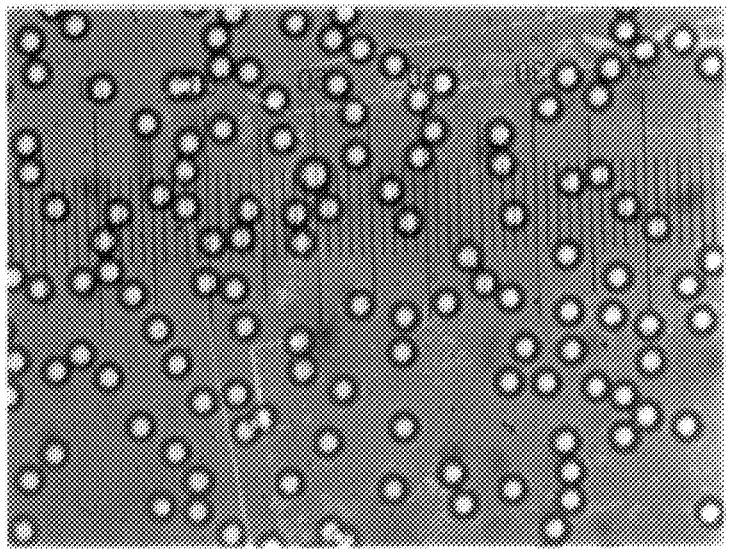
FIG. 3a shows isotropic distribution of polystyrene/ divinyl benzene (55%) spherical particles sold under the Trade Mark Dynospheres (Q 496) in ferrofluid APG 511A before application of a magnetic field (Example 1)

A few drops of the dispersion of Q496 in APG 511A were placed on a microscope slide and subsequently covered with a coverslip. The continuous liquid film thus produced was examined in transmission in an optical microscope and the beads were seen to be randomly or isotropically distributed in the sample as shown in FIG. 3a.

Figure 3B:
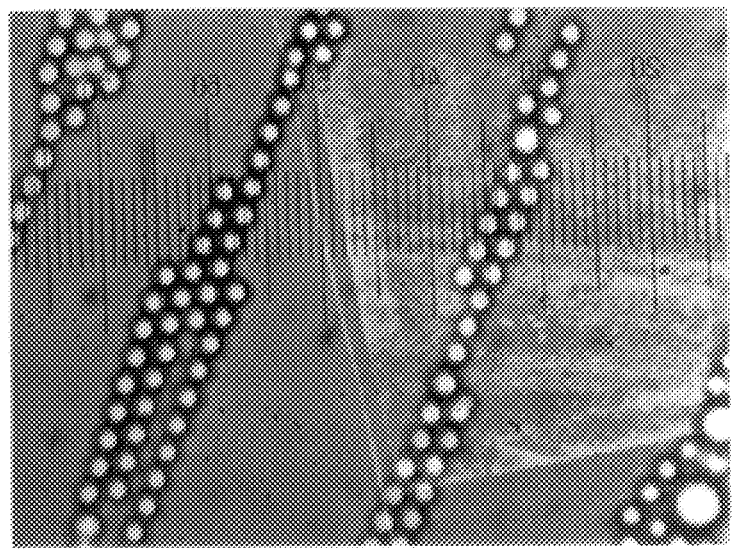
FIG. 3b shows anisotropic distribution in the X-Y plane of the spheres of FIG. 3a after application of a magnetic field parallel to the sample (Example 1)
Figure 3C:
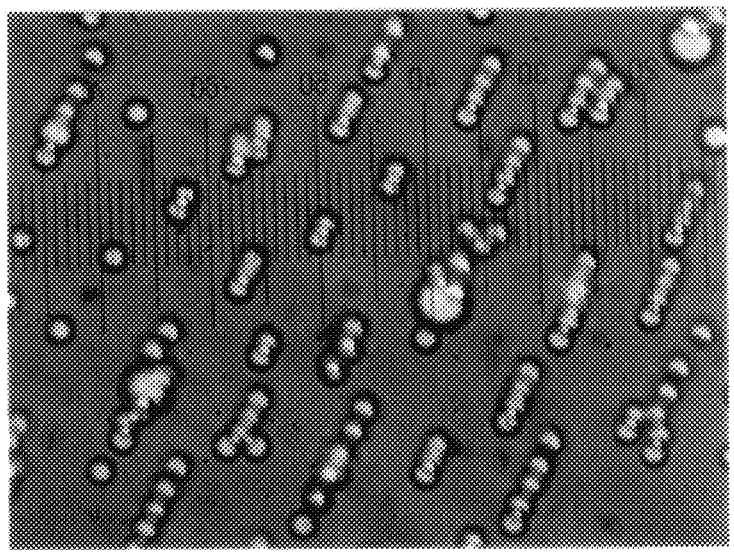
FIG. 3c shows out-of-plane anisotropy (component in Z axis) of the spheres of FIG. 3a after application of a magnetic field at a tilted angle to the horizontal sample (Example 1)

A small laboratory permanent magnet was placed parallel to the sample and the non magnetic beads were seen to align parallel to the field lines of the permanent magnet thereby displaying anisotropic ordering in the so-called X-Y plane as shown in FIG. 3b (i.e. the reference plane of the sample itself). The field induced ordering was lost shortly after the magnetic field was removed from the sample. When the same magnet was placed directly beneath the plane of the sample, the Q496 beads aligned vertically with respect to the reference sample plane. From above, the sample appeared to have a regular lattice array of beads and it was possible to conceal one bead with another by placing the former directly beneath the latter for example. This arrangement describes so-called Z-axis anisotropy, i.e. wherein the structure formed by the included particles resides at right angles to the substrate. When the same magnet was oriented at intermediate angles between 0 and 90 degrees to the horizontal sample, and was brought into close proximity with the sample, the Q496 beads oriented at a tilted angle to the horizontal plane—the tilt angle of the bead chains being governed by the relative position of the applied magnetic field. A tilted structure of beads demonstrating components of ordering in both the X-Y plane and the Z-plane is depicted in FIG. 3c. The transparent beads clearly overlap in this Figure and the uppermost bead resides in a different focal plane from the lowermost. As before all of these anisotropic structures were lost when the stimulating magnetic field was removed from the sample.

EXAMPLE 2

Ferrofluid with non-magnetic particles

In order to demonstrate that anisotropic structures could be locked in, albeit on a temporary basis, the following experiment was conducted. A sample was prepared in accordance with Example 1 except the distance between the coverslip and the microscope slide was set such that it corresponded to a dimension less than the diameter of two Q496 beads, i.e. <20 micrometres. In this arrangement it was not possible to align one bead directly on top of another as expected. Instead a tilted arrangement of spheres resulted such that two spheres became jammed between the substrate and the coverslip. When the magnetic field was removed this anisotropic tilted arrangement persisted indefinitely. The log-jammed structure indicates intimate bead-to-bead and substrate-to-bead contact, thus a connection between the upper substrate (coverslip) and the lower substrate has been realised by way of the included polymer beads. No such connection previously existed because the sample thickness was chosen to be greater than the diameter of an individual bead.

In spite of the fact that the abovementioned structure was retained after removal of the magnetic field, it could nonetheless be broken down by restimulating the sample with a magnetic field, for example applied from a different direction. As such the generated structures were only semipermanent.

EXAMPLE 3

Ferrofluid with non-magnetic fibre particles

A composition such as described in Example 1 was made up except that chopped optical fiber was used in place of the Q496 beads. The fibers were nominally of 7.5 micrometre diameter and nominally 100 micrometres in length. The fibers were obtained from Sumita Optical Glass Inc., Tokyo, Japan and are of the type used in the control of cell thickness in liquid crystal display manufacture. Alignment of these rod-shaped non-magnetic inclusions by the means described in Examples 1 and 2 produced chains with increased contact areas between each chain element (individual fibers) as compared to the spherical beads of Examples 1 and 2.

Because there was a distribution of fiber lengths in the pure fiber sample there was a corresponding distribution of lengths in the fluid composition that contained said fibers. When such a sample was stimulated with a magnetic field normal to the substrate some fibers jammed between the upper and lower substrates whilst some of the shorter lengths could be made 'tumble' by moving a magnet across the sample.

EXAMPLES 4–6

Ferrofluid with inclusion of non-magnetic conductive particles

In the foregoing, alignment in various planes relative to the horizontal substrate plane was demonstrated with a variety of non-magnetic inclusions. Long range chain-like ordering extending over hundreds of micrometres was apparent as was the ability to jam structures in a direction inclined or vertical to the substrate plane.

Figure 4A:
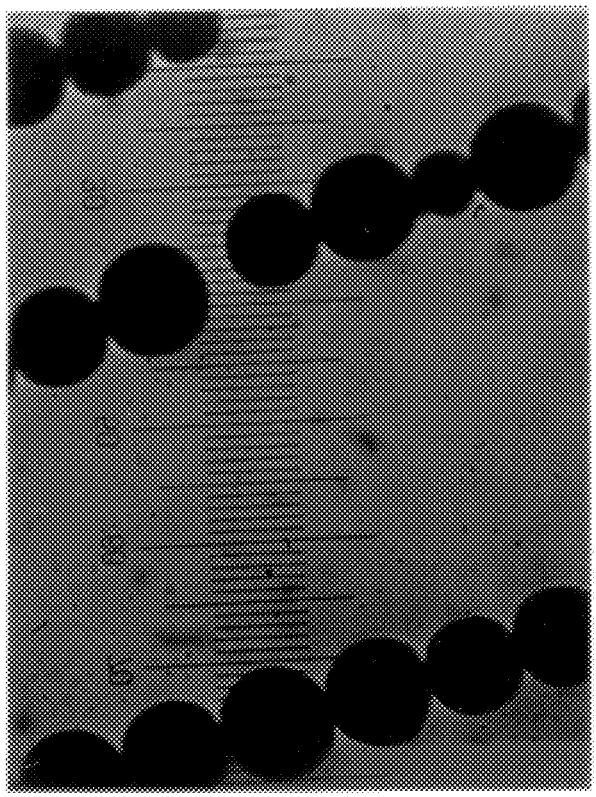
FIG. 4a shows anisotropic alignment of solder particles (Example 4)
Figure 4B:
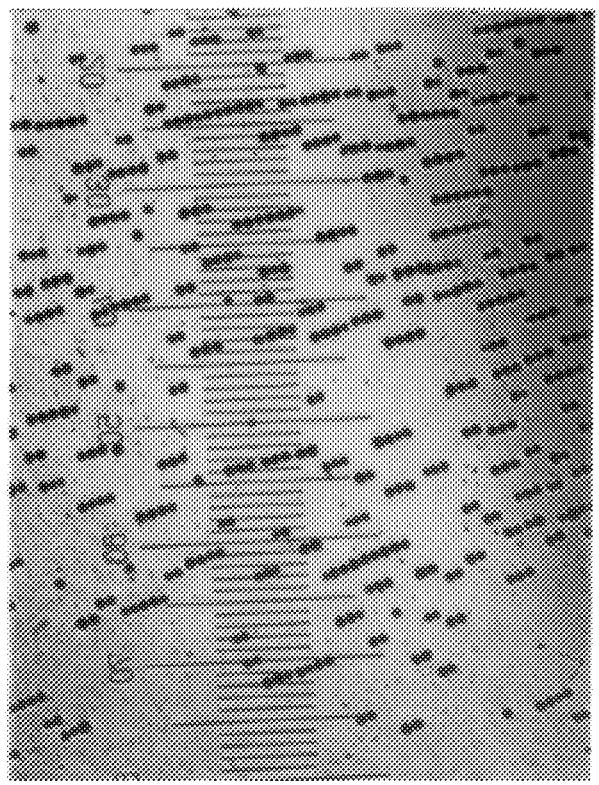
FIG. 4b shows anisotropic alignment of the solder particles (Example 4) at lesser magnification.

However the inclusions described thus far have no additional funtionality. In the present Example alignment of a variety of non-magnetic inclusions in APG 511A is described. These included particles differing from the those of Examples 1–3 in that they possess additional functionality by virtue of the fact that they are either inherently electrically conductive or else are electrically insulating particles coated with a highly conductive topcoat. Thus continuous chains of anisotropic structures could be formed as in Example 1 but this time (Example 4) with beads (solder particles) of an electroconductive metal alloy (63 Sn/37 Pb). The said beads are available from Advanced Metal Technology Inc., Bradford, Conn., USA and were a 400 mesh size which corresponds to 37 micrometre diameter. FIGS. 4a and 4b illustrate intimate bead-to-bead contact of electroconductive but non magnetic particles and long range order (e.g. ten beads—approx. 370 micrometres) respectively.

In Example 5 a similar alignment into chains was obtained with silver coated 'microballons' sold under the trademark Metalite available from The PQ Corporation, Valley Forge, Pa., USA. of mean diameter 48.87 micrometres as measured with the Coulter (Trade Mark) LS Particle Size Analysis apparatus (Fraunhofer optical mode). These, being hollow glass beads coated with pure silver metal, have the advantage over pure metal particles in that they have much lower density and hence are less prone to settlement in a liquid formulation.

In Example 6, the included material was an electroconductive grade (known as E/HM-S) of chopped carbon fiber with a nominal 7 micrometre diameter and a nominal 250 micrometres length. This material was purchased from Grafil Inc., Coventry, UK and is the type used in conventional electromagnetic shielding applications and in so called through-cell electrical connections in the liquid crystal display industry. As before the fibers could be aligned at will with a magnetic field in the magnetic fluid matrix.

EXAMPLES 7–15

Ferrofluid with inclusion of non-magnetic or magnetic conductive particles

A variety of further electroconductive components was included in APG 511A as described in Examples 4–6. These formed continuous chains of intimately contacting particles as before. The particles in these Examples differ however from those in Examples 4–6 in that they all contain a proportion of nickel metal. Polymer beads known as Q504 of regular 10 micrometre diameter available from Dyno Particles AS, Lillestrom, Norway, bearing a continuous electroconductive nickel coating (thickness 50 nanometres), were aligned in a magnetic field when dispersed in APG 511A as described in previous Examples. The same particles, but coated with an additional layer of electroconductive gold (thickness 50 nanometres) were similarly aligned in continuous chains with intimate bead-to-bead contact [Examples 7–8.] As with Example 5, the specialised Q504 particles offer the advantage of low density over solid metal alternatives. Similarly the range of electroconductive particles listed below which comprise nickel in bulk or coated form, were aligned in continuous chains with contact between conducting particles when included in the ferrofluid APF 511A and stimulated with a magnetic field:

EXAMPLE 9 Conductive Nickel Grade HCA-1

EXAMPLE 10 Conductive Nickel Spheres (37 micrometres)

EXAMPLE 11 Conductive Nickel Spheres (60 micrometres)

EXAMPLE 12 Nickel Powder Type 4SP (37 micrometres)

EXAMPLE 13 75% Nickel—Coated Graphite

EXAMPLE 14 15% Silver—Coated Nickel Spheres

EXAMPLE 15 15% Silver—Coated Nickel Flake

The above mentioned materials (Examples 9–15) are available under the Trade Mark NOVAMET from Novamet Speciality Products Corp., N.J., USA and are more conventionally used as electroconductive fillers in resin systems employed in electromagnetic shielding applications.

EXAMPLE 16

Curable ferrofluid adhesive composition with inclusion of non-magnetic particles Previous Examples have highlighted direct contact between electroconductive particles as well as the relatively long range order in aligned chains. This chain order extends over and above the modest requirements of one or a few particle diameters necessary to span typical thickness gaps between two substrates which are to be bonded.

In the present Example APG 511A has been formulated with a photocurable adhesive composition so that the utility of the magnetic fluid component of the formulation can be exploited to form useful anisotropic structures, for example with functional particles, between substrates in the ways described in previous Examples, and these structures can subsequently be locked in whilst simultaneously bonding the said substrates together.

By way of example only, a formulation comprising 95% weight/weight triethylene glycol dimethacrylate, 5% weight/weight acrylic acid together with 0.5–1.0% weight/ weight of the radical photoinitiator 2,2-dimethoxy-2-phenyl acetophenone was admixed in approximately equal volume proportions with ferrofluid APG 511A. To this photosensitive curable ferrofluid mixture was added a qualitative concentration of the Q496 beads described in Example 1. The liquid was aligned in a magnetic field as before (cf Example 1), and whilst it was not as responsive as the pure magnetic fluid because of the dilution with non-ferrofluid monomers, anisotropic ordering of the included non-magnetic particles was evident. The composition was then exposed to UV radiation (primarily 366 nm) for a few seconds which caused the sample to photopolymerise and cure. Following this exposure the coverslip and the microscope slide were found to be bonded together and could no longer move relative to each other when shear forces were applied. Furthermore the anisotropic structures generated before the irradiation process were permanently locked in after the irradiation process. The structures generated in the fluid state and subsequently locked into the solid state could neither relax nor be perturbed by external magnetic fields irrespective of their field strength. An indication of ordering could also be perceived macroscopically with this sample.

Thus for example when the curable ferrofluid mixture containing Q496 inclusions was placed on top of a cylindrical permanent bar magnet, then photocured, a circular image of the magnet's end piece could be seen by unaided visual inspection. This image was permanently set in the sample. This can be explained by consideration of the field induced vertical ordering of the coloured composition relative to the substrate plane which gives rise to a dichroic effect between the aligned area over the pole piece and the unaligned areas distant from the pole piece.

EXAMPLE 17

Curable ferrofluid adhesive composition with inclusion of non-magnetic particles A curable formulation was prepared based on a so-called 'air activated' free-radically polymerisable acrylic monomer composition as described in Example 20 of Loctite Patent Application EP 0 502 733A, the contents of which are incorporated herein by reference. The composition comprises hydroxypropyl methacrylate (8.5 g), methacrylate acid (0.5 g), N-phenyl-2-propyl-3,5-diethyl-1,2-dihydropyridine (0.5 g) and 0.1% iron (III) acetylacetonate in hydroxypropyl methacrylate. The formulation based on this monomer composition, ferrofluid APG 511A and particles Q496 was prepared by admixing the monomer composition with the particle loaded ferrofluid in approximately equal volumes. The mixing was performed in an ambient air atmosphere which is known to activate the curing mechanism in the adhesive component of the formulation. The thus formulated mixture was placed on a substrate which rested on the end of a circular permanent magnet and the liquid was subsequently covered by a coverslip. The mixing time dictated the period during which the layer remained exposed to the air before being closed off from the atmosphere by the coverslip and essentially allowing an anaerobic cure to ensue. As in Example 16, anisotropic structures generated and sustained in the liquid state were permanently set in the cured solid state and could not subsequently relax or be perturbed by an external magnetic field irrespective of their strength. Again a macroscopic dichroic effect could be discerned by unaided visual inspection and again the coverslip and microscope slide were permanently bonded together. It was noted that structural anisotropic ordering of the particles was not retained in a thin boundary zone around the perimeter of the otherwise cured sample. This phenonemon was attributed to lack of cure in this boundary sample/ air interfacial region due to a measure of air inhibition and diffusion into the sample from the edges. This effect further emphasises the importance of cure for the permanent locking of aligned anisotropic structures in the samples.

EXAMPLES 18–19

Curable ferrofluid adhesive composition with inclusion of non-magnetic electrically-conductive particles The present Example describes a composition similar to Example 16 but with inclusion of electroconductive particles in place of Q496 particles. The particles known as Q504 and previously described (in Examples 7 and 8) are crosslinked polystyrene beads of a nominal 10 micrometre diameter and bear a nickel coat or a gold coat deposited on top of a nickel subcoat. Both variants are electroconductive. It is important to note that even though elemental nickel is ferromagnetic, neither the pure coated nickel version nor the gold on nickel-coated version of Q504 could align in response to strong magnetic fields when suspended in non-magnetic liquids, e.g. monomers such as acrylic acid, in contrast to the extensive alignment noted when the same particles were suspended in a ferrofluid (cf. Examples 7–8).

Figure 5:
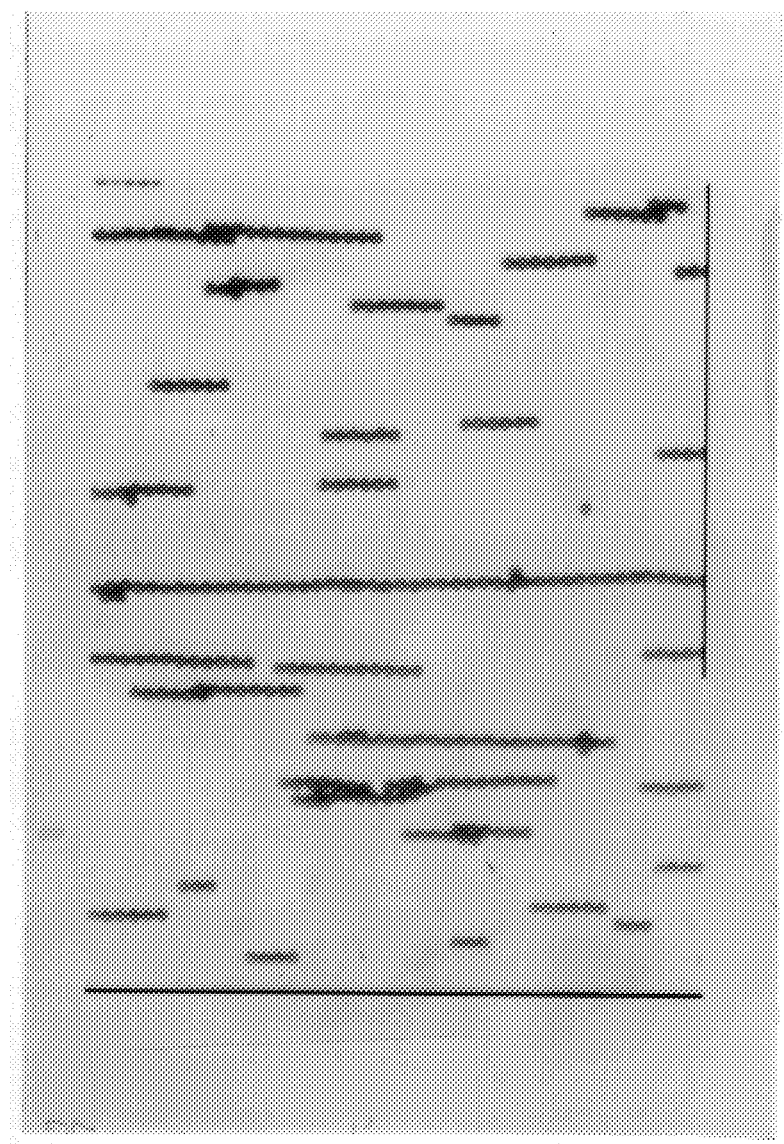
FIG. 5 shows anisotropic alignment of nickel-coated polystyrene spheres (Q 504) in a photopolymerisable monomer/ferrofluid mixture (Example 18)
Figure 6:
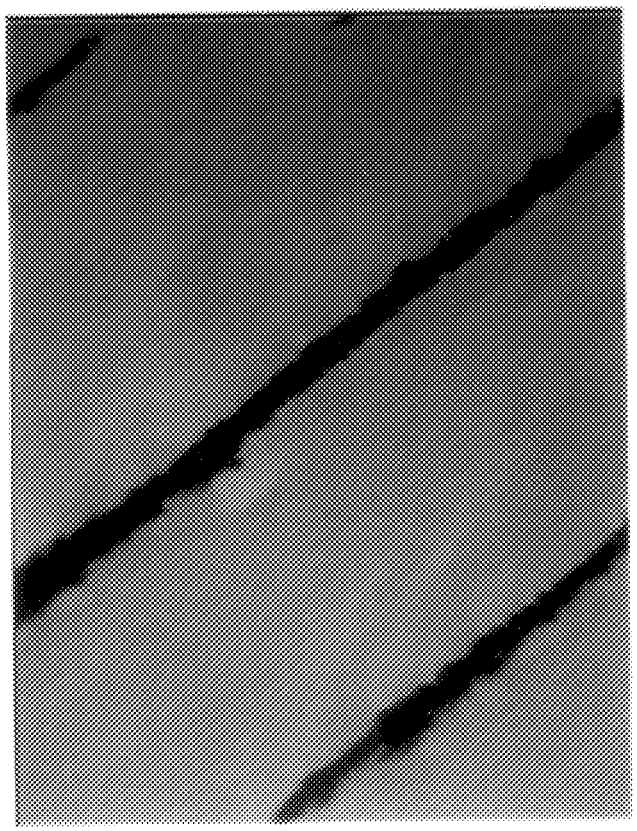
FIG. 6 shows anisotropic alignment of particles of FIG. 5 after polymerization.
Figure 7A:
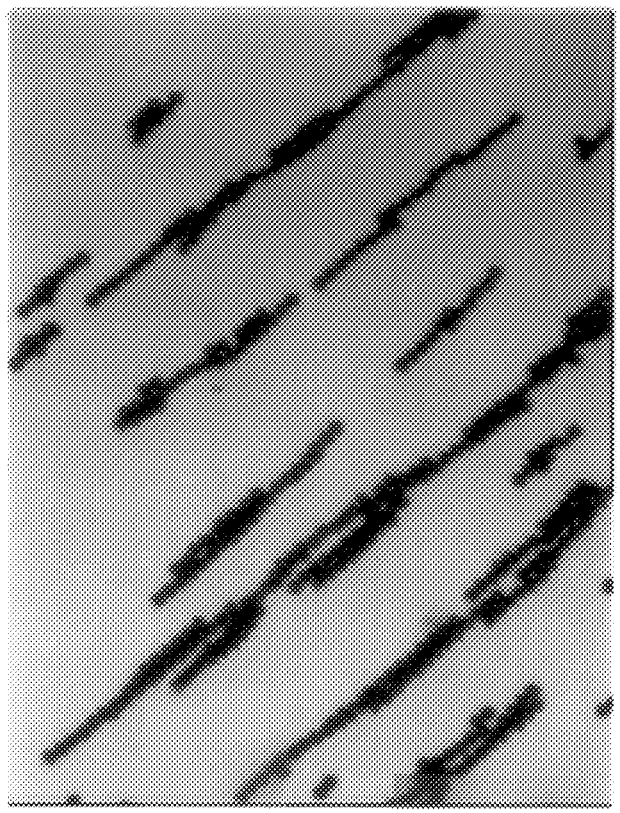
FIGS. 7a and 7b shows anisotropic alignment of gold-on-nickel-coated polystyrene spheres (Q 504) in a photopolymerisable monomer/ferrofluid mixture, (A) before and (B) after UV irradiation (Example 18)
Figure 7B:
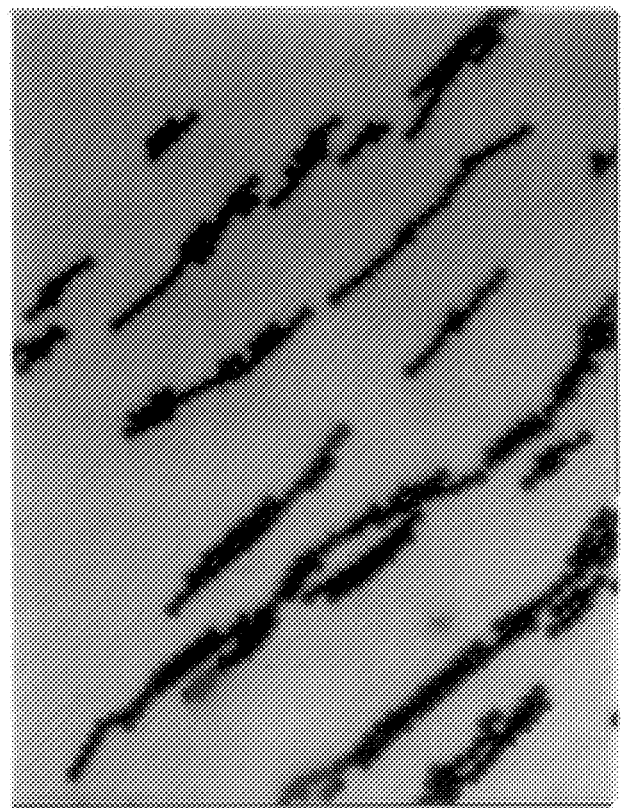

A formulation employing acrylic acid with approximately 1% radical photoinitiator 2,2-dimethoxy-2-phenyl acetophenone and approximately 50% by weight of ferrofluid APG511A was prepared. To this formulation was added a qualitative concentration of Q504 in either the pure nickel-coated or gold on nickel-coated forms [Example 18]. The formulation showed no signs of incompatibility in the liquid form and was quite responsive to magnetic fields. Application of magnetic fields parallel to the substrate caused alignment of the nonmagnetic electroconductive particles. FIG. 5 shows the scale of alignment capable in this polymerisable system using nickel-coated polystyrene particles. The figure shows alignment over some forty particle diameters (>400 micrometres) with intimate contact between the electroconductive beads. A photopolymerised version of this system is shown in FIG. 6. The formulation required 8 seconds to cure (1 W/cm$^2$, 365 nm). After polymerisation the interparticle tracks showed striations indicating phase separation of the now polymerised monomer (acrylic acid) from the ferrofluid. FIG. 7 depicts a "before and after" photocure situation for a similar formulation containing gold on nickel which indicates retention of alignment after photocure and highlights the slight shifting of the particles which accompanies shrinkage during cure in this simple monomer mixture.

Figure 8:
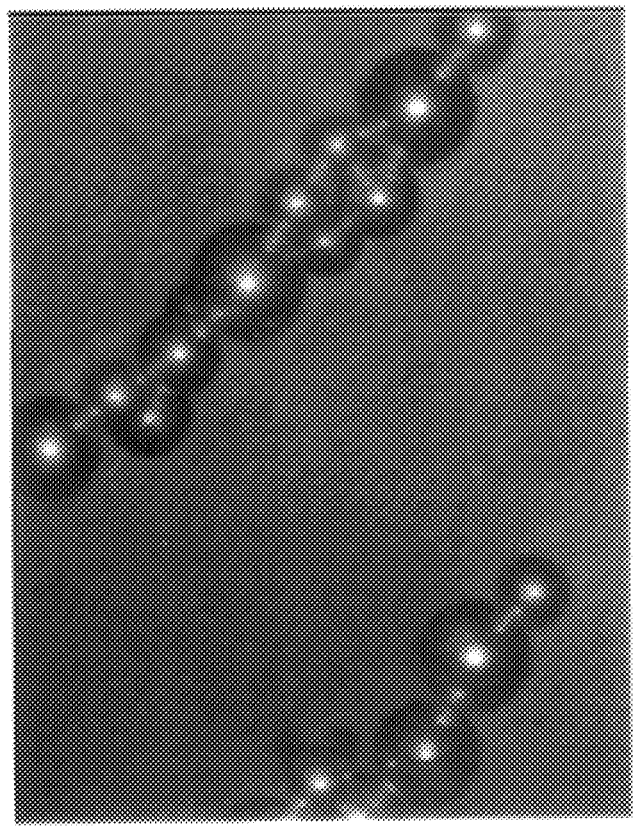
FIG. 8 shows anisotropic alignment of silver-coated glass microballons in a photopolymerised monomer/ferrofluid mixture (Example 19).

Example 19 differs only from Example 18 in that Q504 was replaced with the Silver particles sold under the Trade Mark METALITE as described previously in Example 5. These represent examples of particles which have low density, are electroconductive and are nonmagnetic. Particle size analysis indicates a mean diameter of 49 micrometres for the said particles. FIG. 8 indicates aligned tracks of METALITE beads, again extending over some 400 micrometres (same magnification as FIG. 5) after photopolymerisation. Striations can again be discerned proving polymerisation has occurred.

As with Examples 16 and 17, once polymerisation had been induced in the foregoing Examples (18 and 19), the aligned particles could no longer be perturbed with external magnetic fields and the alignment was permanently set in.

The nickel-coated particles such as Q504 appeared to be much more readily aligned than particles which were not coated with a ferromagnetic material, for example Q496, tested when in a ferrofluid environment (note that they do not align in any other liquid). There thus appears to be a synergism between these particles and the ferrofluids or their mixtures with monomers which can be used to advantage. Nevertheless the nickel-coated particles are regarded as "non-magnetic" within the definition above.

EXAMPLE 20

Anisotropically-conductive ferrofluid adhesive composition

Commercially available ferrofluid (APG 511A) was formulated with acrylic acid in a 1:1 mixing ratio. The mixture was checked under a microscope to ensure that a uniform magnetic fluid was intact. The mixture was both uniform and responsive to magnetic field gradients. To the mixture was added 6% w/w (weight/weight) of radical photoinitiator, 2, 2-dimethoxy-2-phenyl acetophenone and 20% w/w of spherical gold-coated polymer beads of 12 micrometre diameter available from Sekisui Fine Chemical Co., Osaka, Japan. One sample of the mixture was spread on a glass plate, covered with a transparent slip and aligned in a uniform magnetic field of 300 Oe applied normally to the sample. Gentle pressure was applied to the top plate after ordering of the beads. The sample was photo cured on exposure to UV light from below (20 seconds, 100 mW/cm$^2$). Order was seen to be preserved after cure.

To a second sample of the above mixture was added 2% w/w of radical thermal initiator AIBN (2, 2'-azobis isobutyronitrile). This sample could be thermally cured in an oven at 110° C. for 30 minutes. The liquid sample was applied to a test circuit comprising a patternwise delineated array of parallel copper tracks of 100 micrometre width and separated by a maximum of 150 micrometres and a minimum of 35 micrometres. This sample was aligned in a uniform magnetic field of 300 Oe strength applied in a normal direction. Conductor beads adopted an ordered disposition with no two beads touching when the sample was further confined with a top plate. Transparent electrically insulating top plates were used to check ordering and electrical continuity in the XY plane whereas copper top plates were used to test electrical continuity in the Z-axis, i.e. in the direction normal to the bondline. The ordered sample was clamped in a specially designed rig and placed in an oven to induce thermal cure. Order was preserved after clamping and curing verified by independent checks. Z-axis contact resistance, measured by the four point probe method with a Gen Rad 1689 Precision RLC Digibridge, for the cured sample averaged 0.9 ohm whereas XY contact resistance measured between nearest neighbour conductive tracks on the test circuit was in the megaohm range.

EXAMPLE 21

Anisotropically-conductive adhesive composition in which monomer forms the ferrofluid matrix Examples 16 and 17 describe the locking in of ordered structures of non-magnetic beads which were previously aligned in admixtures of standard polymerisable monomers and commercially available ferrofluids using uniform magnetic fields.

The present example describes the preparation and testing of polymerisable monomers which are inherently ferromagnetic liquids and which also contain non-magnetic conductive microparticles.

Magnetite particles of average particle diameter 9.7 nanometres, (Liquids Research Limited, Unit 3, Mentech, Deiniol Road, Bangor, Gwynedd, U.K.) were coated with oleic acid and dispersed in heptane at an appropriate content (3.5% and 8.4%) by volume magnetite to produce fluids with magnetisation saturation of 100 G and 250 G as described below. Five mililitres of the above mentioned heptane-based material was added to 5 ml of triethyleneoxide dimethacrylate (triegma) and a further 2 ml of a secondary surfactant was added which was an acid form of an aromatic phosphate ester sold under the Trade Mark GAFAC RE610 by GAF (Great Britain) Limited and now available as RHODAFAC RE610=GAFAC RE610 from Rhone Poulenc Chimie, France. This is described as nonoxynol-9-phosphate.

Removal of the heptane left a good uniform ferrofluid on visual inspection which responded to a magnetic field gradient. After standing for 72 hours in a glass bottle, however, the unstabilized colloid polymerised to a brittle solid.

In a second experiment the polymerisable material was now butane diol dimethacrylate which is less sensitive to atmospheric oxidation than triegma. Using the same proportions as above, a good quality ferrofluid resulted with good stability. Fluids with magnetisation saturation of 100 G and 250 G were thus prepared. The saturation magnetisation curve was steep and typical of superparamagnetic systems in that it exhibited no hysteresis. These fluids, even when formulated with radical initiators, were stable for periods of one year at room temperature when stored in air permeable polyethylene bottles such as those used for the storage of traditional anaerobic adhesives by those skilled in the art.

The butane diol dimethacrylate ferrofluids could be polymerised in the bulk with standard radical photo and thermal initiator systems. It is likely that the triegma system polymerised through a redox-initiated polymerisation given the easily oxidised nature of the dimer backbone and the fact that iron is present in the system. It is believed that appropriate selection of stabilizers would avoid this problem.

To the butane diol dimethacrylate based ferrofluid of 100 G was added approximately 5% weight/weight spherical gold-plated cross-linked polystyrene microparticles of 7 micrometre diameter.

The said particles are essentially monodisperse (i.e. of substantially uniform shape and diameter) and are an article of commerce from Sekisui Fine Chemical Co Ltd, Osaka, Japan.

The particle loaded polymerisable ferrofluids were aligned in a permanent magnet capable of generating a uniform magnetic field which was continuously variable up to 300 Oe. The said magnetic field could be applied in directions either parallel or perpendicular to the ferrofluid adhesive sample. The permanent magnet was designed to be mountable on an optical microscope so that the aligning process could be monitored in real time. To the underside of the magnetic microscope stage was fitted a parabolic mirror with an optical waveguide fitted in its centre. The waveguide was linked to a remote UV source (EFOS Ultracure 100 SS, available from Jenton International, Andover, Hants. UK).

The conductive microparticles were aligned in the ferrofluid adhesive matrix (formulated with the photoinitiator from Example 20 at 6% w/w) confined between two optically transparent substrates. Alignment was judged to be sufficient after some 60 seconds with the field perpendicular to the sample plane. The samples were examined in reflection with the parabolic mirror acting as reflector and means for concentrating light onto the sample for the purposes of photocure. The sample was irradiated from below (20–60 second bursts). The matrix polymerised and took on a fine grain structure not present in the liquid state. The two substrates were bonded together and the regular conductor array could no longer be disturbed when stimulated with a magnetic field.

Figure 9A:
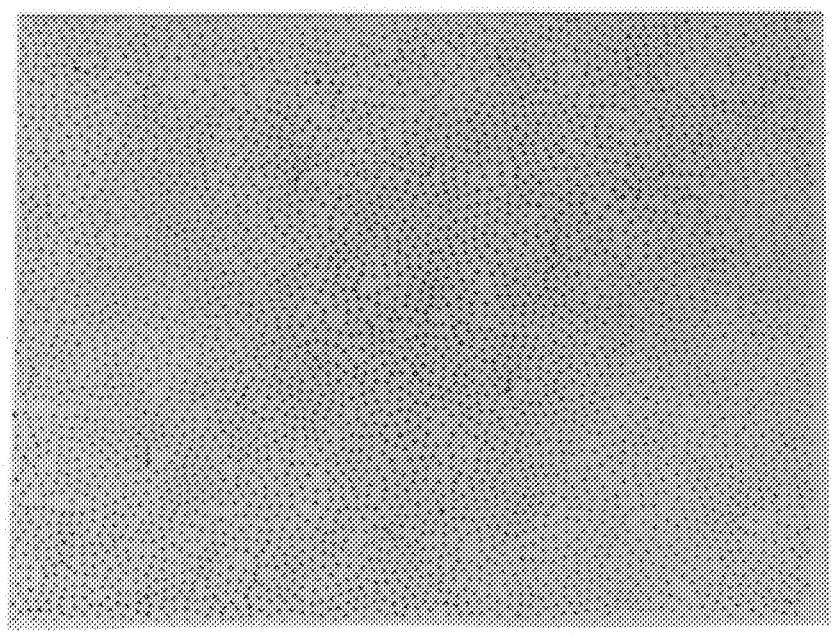
FIG. 9a shows an optical micrograph at 40× magnification of 7 micrometre gold-plated polystyrene beads aligned and cured in a ferromagnetic acrylic adhesive following exposure to a uniform magnetic field.
Figure 9B:
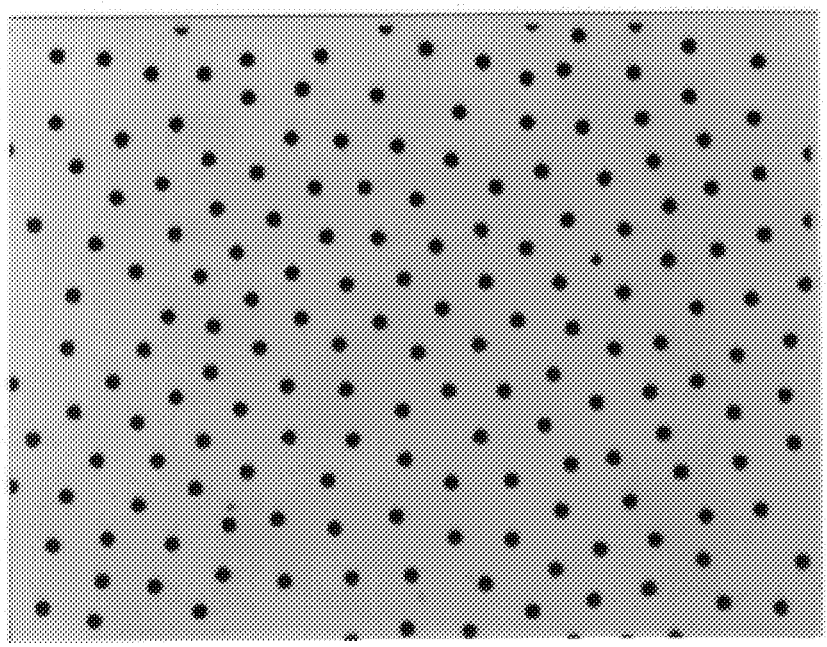
FIG. 9b shows a detail of the sample of FIG. 9a at 200× magnification (Example 21).

The quality of the particle ordering was high and was assessed with the aid of an Optical Image Analyser (Buehler Omnimet 3 Image Analyser, Ill., USA). Optical field images of ordered conductor particles (7 micrometres) in polymerised ferrofluid acrylic matrices are shown in FIG. 9. FIG. 9a at 40× magnification shows the macroscopic nature of the effect while FIG. 9b at 200× magnification shows the ordering of the particles in a detail of the sample. It can be seen that no aggregation of particles is evident. The high quality ordering was achieved on a macroscopic scale on a sample of some 600 mm$^2$ with the current system.

Ordering quality was assessed over 60 representative optical fields taken at random from the same sample. The conditions and data for the test were as follows:

Magnetic field: Uniform 300 Oe applied perpendicular to the sample plane.

Conductors: gold-coated cross-linked polystyrene 7 micrometre beads at approximately 5% wt/wt.

Matrix: ferromagnetic dimethacrylate 100 G with photoinitiator as per Example 16.

1× Optical field area: 105 micrometres$^2$

Total Area Examined: 6×10$^6$ micrometres$^2$

Field Count: 60

Magnification/Geometry: × 200 in Transmission (for Image Analysis)

Area covered by particles per field: mean=5173.3 micrometres$^2$, std.dev=605 micrometres$^2$.

Area % covered by particles per field: mean =5.136%; std. dev.=0.601%.

Particle count per field: mean=159; std. dev.=18.

Sample Area occupied by single particles: 5.071%.

Sample Area occupied by two particles touching: 0.057%.

Of the 9566 particle objects detected in the 60 fields, only 46 appeared as two particle aggregates (mean length=13.8 micrometres; std. dev. –0.72 micrometres; some may be slightly tilted). Only one single object in the 9566 objects (which corresponds to 104 ppm) appeared as an aggregate 18.3 micrometres in length. These data suggest that this system is capable of resolving electrical contacts separated by approximately 18 micrometres with a high degree of confidence.

Samples were electrically tested on test circuits with a minimum of 35 micrometres track separation. The test circuit comprised 60 interdigitated metal tracks each 100 micrometres wide deposited on a float glass substrate. The metalisation pattern comprised a thin layer of copper sputtered onto a titanium tungsten seed layer. A 1 g sample of the ferrofluid acrylic adhesive containing 0.15 g of 5 micrometre gold-coated polystyrene beads and 0.01 g of the radical photoinitiator cited in Example 16 together with 0.02 g of radical thermal initiator AIBN was smeared onto the electrode array and an ITO (indium tin oxide) coated glass top electrode (60×12×1 or 2 mm) was placed on the liquid sample. The sample was stimulated with a uniform magnetic field and the ordering was checked with a microscope. Pressure was applied to the sample in a controlled fashion in a press fitted with a pressure transducer. Pressures of up to 3 MPa were applied to samples to achieve bondline thicknesses not more than the diameter of the conductive particle. The sample was thermally cured under pressure. The contact resistance was 1 ohm in the Z direction, i.e. through the bondline. When the measurement was made with a copper top plate in place of the ITO plate, the Z axis contact resistance was in the order of 0.5 ohm. When an insulating glass plate was used as top electrode and contact resistance was measured in the bondline XY plane between nearest neighbour tracks, values of 5 megaohms were typical. Electrical measurements were made using the four point probe method with Gen Rad 1689 Precision RLC Digibridge.

EXAMPLE 22

Epoxy resin adhesive composition in which the monomer forms the ferrofluid matrix Example 21 described the preparation, characterisation and testing of acrylic based adhesives. The present example describes the preparation of epoxy-based ferromagnetic adhesives.

A ferromagmetic epoxy resin adhesive was prepared as follows:

1. Surfactant coated magnetite particles, similar in size to those cited in the above mentioned example, were dispersed in heptane to produce a regular ferrofluid.
2. The particles were next flocculated in acetone, mixed with a standard bisphenol A diglycidyl ether epoxy resin (10 mls of ferrofluid to 10 g of epoxy) and 0.8 g of the secondary surfactant GAFAC RE610 (cf. Example 21) was added which was compatible with the resin.
3. Temperature was raised to 115° C. to ensure thorough mixing and the solvent was subsequently removed. Care was taken not to heat much beyond 130° C. to avoid thermal polymerisation.

The above procedure produced a 240 G ferromagnetic epoxy composition which was subsequently formulated with either a photocationic initiator such as GE1014 (General Electric) at 1–2% v/v or a latent amine hardener such as that described in Example 1 of GB 1121196 which is an article of commerce from Ciba-Geigy sold as product HT9506. The latter was formulated at close to stiochiometric equivalents. The alternative formulations thus produced either photosensitive epoxies curable with UV irradiation, or thermally sensitive epoxies curable by heating up to 150° C. for up to 30 minutes. The original bulk viscosity of the epoxy filled with magnetite was 1.4×10$^6$ mPa s at 250° C. measured with a shear rate of 10$^{-1}$ on a Haake rheometer (Karlsruhe, Germany). In order to achieve particle ordering in these ferrofluid epoxies when microparticles were subsequently admixed, it was necessary to dilute the formulations with reactive epoxy diluents (1:1 and 1:2, epoxy: diluent for photo and thermal curing adhesives respectively) such as the short chain diepoxies available from Dow Chemical Company (e.g. DER 736 Epoxy resin). Light sensitive samples were photocured for 60 seconds with a 100 W UVALOC lamp whereas thermally sensitive samples cured at 100° C. after 15 minutes heating. Particle loaded samples were subjected to similar conditions for aligning, characterising and testing as those described in the previous example and similar results were achieved, the contact resistance being Ohms in Z axis and MOhms in XY axis for samples with a nominal loading of 5% w/w of gold-coated particles having an average diameter of 12 micrometres.

EXAMPLE 23

Anisotropically-conductive ferrofluid solder composition

A commercially available solder powder (in the form of uniform beads of a diameter of about 40 micrometres) [Advanced Metal Technology Inc., Bradford, Conn., USA] is added to the commercially available ferrofluid APG 511A (Advanced Products and Technologies Ltd., Oxford UK which is a subsidiary of Ferrofluidics Corp. Nashaua, N.H., USA). Each component is present to the extent of 50 weight percent. The viscosity of the ferrofluid is 40 mPa s at 27° C. The solder particles behave as magnetic holes in the ferrofluid and can be aligned by a magnetic field as disclosed in Example 4. After the composition has been applied to a substrate the solder particles are fused together by heat and this action causes adhesion of the conductive solder to the substrate. The experiment is repeated so that the ferrofluid-solder mixture is confined between two substrates which are conductive and which can normally be easily wetted by solders e.g. tinned substrates or cleaned copper substrates which may or may not have pattern delineation. The solder particles are aligned as before in the ferrofluid and are fused together by heat and this action serves to electrically connect the upper and lower substrates together. For patternwise delineated substrates the resolution technique is determined by the solder bead diameter (in this case approximately 40 micrometres), the solder particle concentration and the strength of the aligning field.

The ferrofluid, which has served its function of aligning the solder particles, is now redundant but may be left in place, encapsulated subsequently with a conventional adhesive, sealant or potting composition, or recovered with a magnet from the assembly, after which the ferrofluid may be recycled for subsequent use and the vacated space may if desired be filled with a conventional curable insulating material. This added material may have adhesive properties to reinforce the conductive bridge and will help to hold the particles in place while also preventing any electrical jumping from one bridge to another or entry of contaminants which may short out or cross one conductive bridge with another.

EXAMPLE 24

Ferrofluid compositions containing particles with heat-activated adhesive layer

Adhesive coated polymer beads of uniform 7.25 micrometre diameter available from Sekisui Fine Chemical Co, Osaka, Japan (Type CB) were added to the commercially available ferrofluid APG 511A (Advanced Product and Technologies Ltd, Oxford, UK) as before, i.e., 50% w/w. The particles behave as magnetic holes in the ferrofluid matrix and therefore may be ordered in structural arrays by means of a uniform magnetic field. The ferrofluid mixture comprising said beads was confined between two glass substrates and the assembly was subjected to a magnetic field which ordered the beads. The substrates were clamped together and heated to 140° C. for 30 minutes which activated the adhesive coating on the beads. Due to the relatively small contact area the bond made by the coated beads was not strong. The bond can be supplemented by removing the ferrofluid matrix from between the substrates and replacing it with conventional adhesive.

Gold-coated 7 micrometre polymer beads are available from the same supplier as the aforementioned particles but adhesive-coated, gold-coated particles were not immediately available. The latter particles are viewed as being useful with regard to bonding and electrical conduction especially when the space between the substrates is filled with adhesive as previously described.

EXAMPLE 25

Anisotropically-conductive composition in which solder flux forms the ferrofluid matrix A ferromagnetic solder flux was prepared from a solid rosin which has abietic acid as its chief constituent. The flux was prepared by the redistribution of special grade magnetite particles of 9.7 nanometers average particle diameter into solutions of rosin followed by removal of the solvent. A high quality ferrofluid resulted which solidified on cooling from the melt. The ferrofluid solder flux was used as a matrix for solder particles (63Sn/37Pb) which were nominally 20–25 micrometre diameter. The solder particle loading was approximately 20% w/w. The ferrofluid rosin-solder particle mixture was tested on a custom designed test circuit. The circuit consisted of 60 interdigitated copper electrodes grouped in sets of ten tracks. Each track was 100 micrometres wide and the inter track separation decreased in steps of 25 micrometres from an initial 150 micrometres. The metalisation pattern was deposited on a float glass substrate. The ferromagnetic rosin with solder particles was melted at about 135° C. which was an insufficiently high temperature to melt the solder itself. The molten sample was covered with a transparent, insulating top plate and inserted into a specially designed permanent magnet which provided a uniform field of 300 Oe over areas of 1 $cm^2$ or slightly greater. The sample was stimulated in this case with a field set normal to the plane of the test sample. The magnetic system was designed for mounting onto a laboratory microscope and the ordering of the solder particles in the molten ferromagnetic flux could be observed. The ordered solder particles retained their positions relative to one another (none touching) when the sample cooled in the magnetic field. The system could be reworked by remelting.

A similar sample was prepared on the test circuit except that in this case, a copper conductive top plate (60×12×1 or 2 mm) was used in place of the insulating glass plate. Ordering was checked by microscopic inspection from the underside of the sample which indicated particle separation and ordering of the beads in the intertrack spaces. Contact resistance measurements made normal to the bondline formed by the flux/solder paste indicated were approximately 1 Ohm in magnitude and no inter track connectivity could be observed above 25 micrometres separation.

When samples similar to those described in the preceding paragraphs were clamped and heated to greater than the melting point of the solder particles (approximately 180° C.) and re-examined optically and electrically, the following results were obtained:

Electrical contact resistance in the Z-axis, i.e. normal to the bondline averaged 0.2 ohm and no bridging of neighbouring tracks in the XY plane was observed above the 25 micrometre track separation.

Figure 10A:
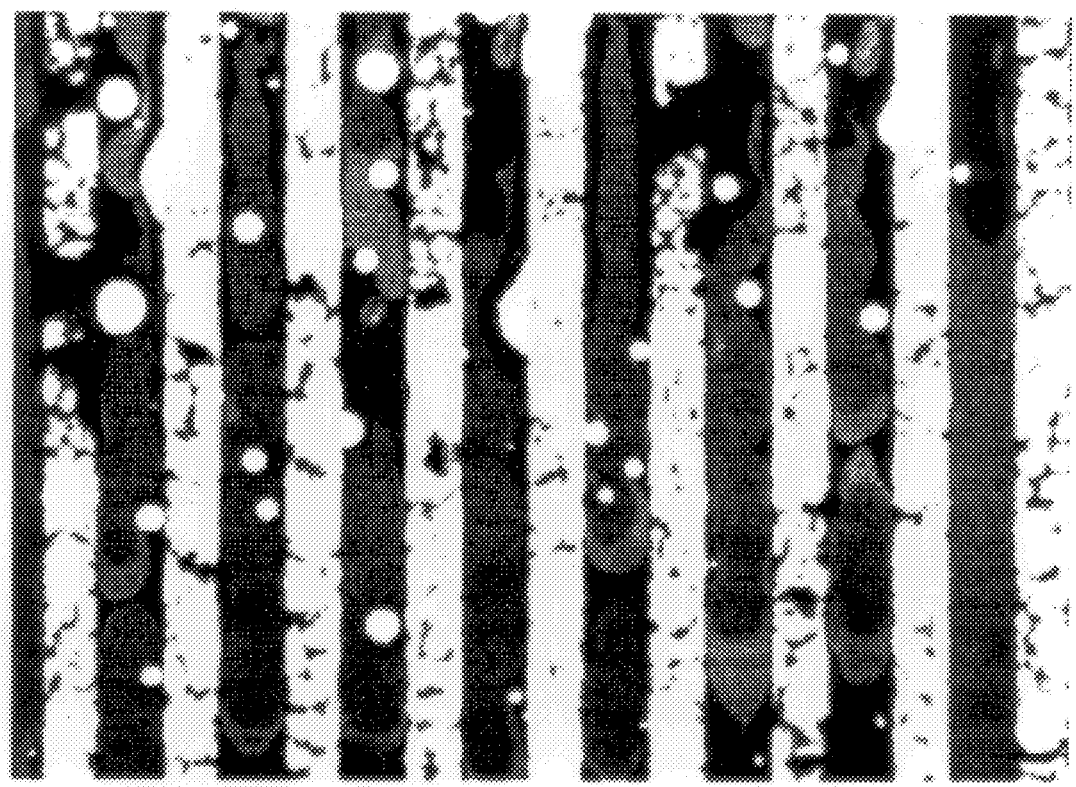
FIG. 10a shows an optical micrograph at 40× magnification viewed in reflection through the top glass plate of a bonded assembly of glass plates one of which carries copper tracks 100 micrometres in breadth, with a ferrofluid rosin solder sample between the substrates after ordering and melting of the solder (Example 25).
Figure 10B:
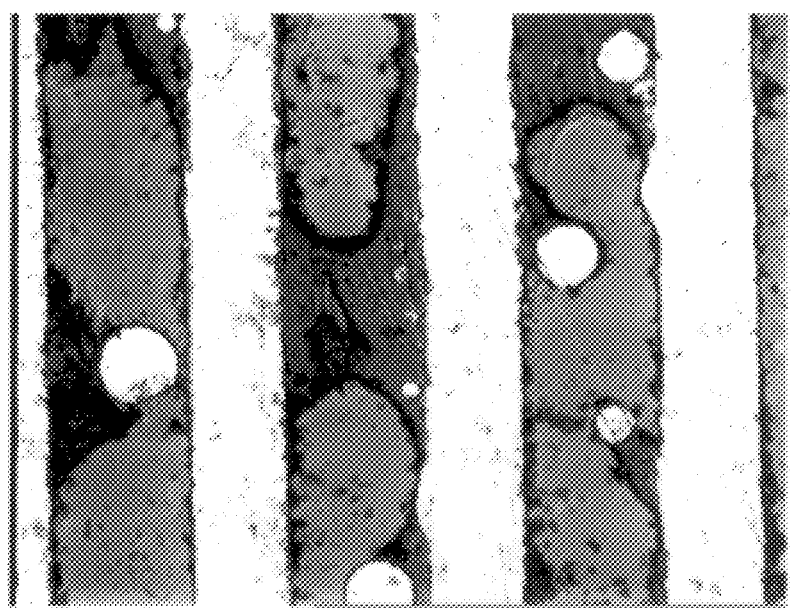
FIG. 10b shows a detal of a sample similar to that of FIG. 10a at 200× magnification.

Even in the case of the 25 micrometre track separation, the vast majority of these tracks were not bridged. FIG. 10 shows solder plating of 100 micrometre tracks after melting of ordered particles; melted particles in intertrack spaces are also seen, these do not contribute to contact resistance. The sample is viewed in reflection (×40 magnification in FIG. 10a and ×200 magnification in FIG. 10b) from above through a clear glass plate. The bright areas are the tracks coated with solder. The inter-track areas are mainly grey with black zones of magnetite-filled rosin and light circles of solder.

This example may be varied by carrying out the heating step to melt the solder while the magnetic field is applied.

EXAMPLE 26

Preparation of a Ferrofluid/Gold Co-colloid

A gold sol was prepared as follows: 1 $cm^3$ of a 1% solution of Hydrogen Tetrachloro Aurate ($HAuCl_4 \cdot 3H_2O$) available from the Aldrich Chemical Co. UK, Gillingham, Dorset was added to 100 $cm^3$ of distilled water. At this point 2.5 $cm^3$ of a 1% sodium citrate solution was added and the mixture was kept just at the boil. After a few minutes a blue colour became apparent followed shortly after by a ruby red colour.

The ruby red gold sol, which was stable at room temperature, was added in an approximately 1:1 volume/volume ratio to the commercially available aqueous based ferrofluid known as EMG 708 (a Ferrofluidics Corp., Nashau, N.H., USA, product) available from Advanced Products and Technologies Ltd., Oxford, UK. The mixed sol and ferrofluid showed no signs of incompatibility even after several weeks storage at room temperature. Some chopped glass fibres nominally of 7.5 micrometre diameter (cf. Example 3) were added as internal standards to aid visual examination under the optical microscope.

A drop of the mixture was placed on a microscope slide and covered with a cover slip. Examination by microscope showed a uniform heterogeneous viewing field with an orange-brown colouration (colour dominated by the ferrofluid) and no discernible features whatsoever except for the few deliberately added focusing aids in the form of chopped glass fibre.

On the application of a magnetic field from a small laboratory permanment magnet, the optical field was seen to develop features in the form of aggregates of the non magnetic component (gold) which formed lines parallel to the direction of the applied magnetic field. The lines of what is effectively destabilized gold colloid or aggregates of gold generated in situ, could be oriented at will by movement of the stimulating magnetic field. In this Example the gold aggregates are behaving as magnetic holes in the ferrofluid matrix.

Figure 11A:
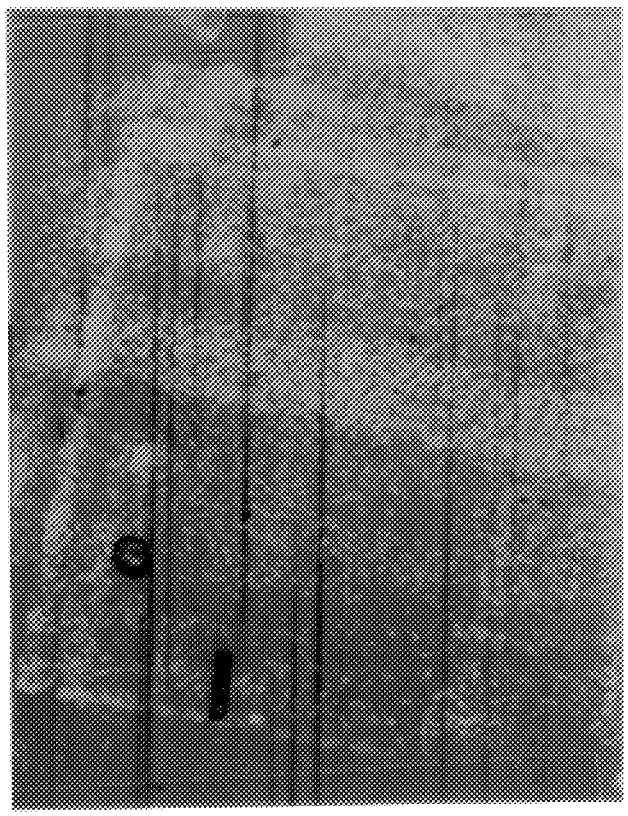
FIG. 11a shows a photomicrograph at 50× magnification indicating anisotropic alignment of lines of aggregated gold particles developed in situ by destabilizing a gold sol which was admixed with a ferrofluid.
Figure 11B:
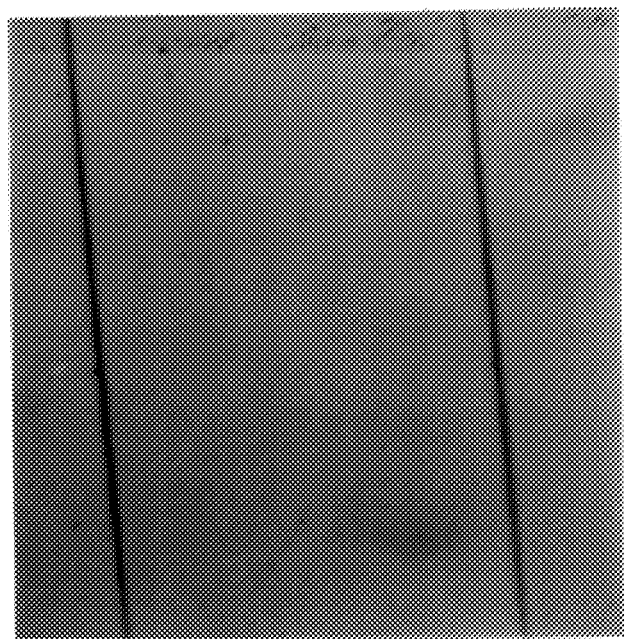
FIG. 11b shows the same system at 200× magnification (Example 26).

FIG. 11a shows a photomicrograph at 50× magnification after the application of a magnetic field to the co-colloidal system. The object in the lower left hand corner of the photograph is a glass fiber of approximately 7.5 micrometre diameter and is useful as an internal size standard, thus the lines of gold aggregates are of less than a few micrometres in width and thousands of micrometres in length. FIG. 11b shows further detail of these fine parallel gold lines. It should be noted also that the lines of aggregated gold can be oriented normal to the substrate.

A gold sol may be prepared in a polymerisable matrix such as methyl methacrylate according to the procedure of Nakao (J. Chem Soc., Chem Commun., 826, 1993); more elaborate methods for the preparation of gold colloids in polymerisable systems have been described by Cardenas et al. (loc. cit.). The gold sol in monomer is mixed with a polymerisable ferrofluid composition such as those described in Examples 17–20. The magnetic field is applied to effect alignment of magnetic holes comprised of aggregated gold according to the procedure detailed above. The composition is cured to lock the structure in place.

Although Examples 1–15 and 26 do not describe curable compositions, and Examples 1–3, 16 and 17 do not describe the inclusion of electrically-conductive particles, inferences may be drawn from these Examples concerning the behaviour of the respective components when combined in a composition according to the invention. Therefore the components used in Examples 18–22 may be varied by substitution of equivalent components from earlier Examples.

INDUSTRIAL APPLICABILITY

The invention is capable of exploitation in the electronics industry for the assembly of components having respective sets of conductors.

We claim:

1. A method of providing anisotropic conductive pathways between two sets of conductors which comprises forming said pathways with a plurality of electrically conductive particles having substantially uniform sizes and shapes, said electrically conductive particles having been arrayed in a regular pattern by application of a substantially uniform magnetic field to a composition comprising (i) a plurality of electrically-conductive particles having substantially uniform sizes and shapes dispersed in either (ii) a ferrofluid comprising a colloidal suspension of ferromagnetic particles in a non-magnetic carrier liquid, or (iii) a mixture of a ferrofluid comprising a colloidal suspension of ferromagnetic particles in a non-magnetic carrier liquid and a curable liquid composition.

2. A method according to claim 1 wherein the electrically-conductive particles are arrayed in a regular pattern in a monolayer, in columns, or both.

3. A method according to claim 1 wherein the separation between the respective sets of conductors is substantially equal to or less than the average diameter of the electrically-conductive particles.

4. A method according to claim 1 which includes applying pressure to urge the respective conductors towards one another.

5. A method of forming anisotropic conductive pathways between two sets of conductors wherein a layer of a curable composition is applied to one set of conductors and a second set of conductors is brought against the layer of curable composition after which the composition is cured in a composition curing step, the method characterized in that:

(a) the curable composition comprises (i) a plurality of electrically-conductive particles having substantially uniform sizes and shapes dispersed in either (ii) a ferrofluid comprising a colloidal suspension of ferromagnetic particles in a curable non-magnetic carrier liquid, or (iii) a mixture of a ferrofluid comprising a colloidal suspension of ferromagnetic particles in a curable or non-curable, non-magnetic carrier liquid and a curable liquid composition; and (b) the method further comprises applying a substantially uniform magnetic field to the curable composition such that interaction between the ferrofluid and the electrically-conductive particles causes the electrically-conductive particles to form a regular pattern before the composition is cured and the composition curing step is performed while the electrically conductive particles are formed into said pattern so as to lock the pattern in position.

6. A method according to claim 5 which includes applying pressure to urge the respective sets of conductors towards one another before, during, or before and during the curing step.

7. A method according to claim 5 wherein the separation between the respective sets of conductors at the time of curing is substantially equal to or less than the average diameter of the electrically-conductive particles.

8. A method of making an anisotropically conductive bond between two sets of conductors, wherein a layer of adhesive composition is applied to one set of conductors and a second set of conductors is brought against the layer of adhesive composition after which the composition is cured in a composition curing step, the method characterized in that:

(a) the adhesive composition comprises (i) a plurality of electrically-conductive particles having substantially uniform sizes and shapes dispersed in either (ii) a ferrofluid comprising a colloidal suspension of ferromagnetic particles in a curable adhesive non-magnetic carrier liquid, or (iii) a mixture of a ferrofluid comprising a colloidal suspension of ferromagnetic particles in a curable or non-curable, magnetic carrier liquid and a curable adhesive liquid composition; and (b) the method further comprises:

exposing the layer of adhesive composition to a substantially uniform magnetic field such that interaction between the ferrofluid and the electrically-conductive particles causes the electrically-conductive particles to form a regular pattern of particles each in electrical contact with an adjacent particle and/or with a conductor in one or both sets of conductors or with both a particle and one or two conductors, whereby conductive pathways are provided from one set of conductors to the other set, each pathway comprising one or more of the electrically-conductive particles, before the adhesive composition is cured; and the composition curing step is performed while the electrically conductive particles are formed into said pattern so as to lock the pattern in position.

9. A method according to claim 8 which includes applying pressure to urge the respective sets of conductors towards one another before, during, or before and during the curing step.

10. A method according to claim 9 wherein the separation between the respective sets of conductors at the time of curing is substantially equal to or less than the average diameter of the electrically-conductive particles.

11. A method according to claim 8 wherein the magnetic field is applied normal to the layer of adhesive composition and the electrically-conductive particles form a regular array of particles in a monolayer, or in columns.

12. A method according to claim 8 wherein the magnetic field is applied parallel to the layer of adhesive composition and the electrically-conductive particles form parallel chains of particles, each in electrical contact with an adjacent particle or particles of the same chain.

13. A method according to claim 8 wherein the separation between the respective sets of conductors at the time of curing is substantially equal to or less than the average diameter of the electrically-conductive particles.

14. A method of making an anisotropically conductive bond between two sets of conductors wherein a layer of a composition comprising particles with a latent adhesive property is applied to one set of conductors and a second set of conductors is brought against the layer of the composition after which the latent adhesive property of the particles is activated, the method characterized in that:

(a) the particles with a latent adhesive property are electrically-conductive particles having substantially uniform sizes and shapes;

(b) the composition comprises (i) a plurality of said particles with a latent adhesive property dispersed in either (ii) a ferrofluid comprising a colloidal suspension of ferromagnetic particles in a non-magnetic carrier liquid or (iii) a mixture of a ferrofluid comprising a colloidal suspension of ferromagnetic particles in a non-magnetic carrier liquid and a curable liquid composition; and (c) the method further comprises:

exposing the layer of the composition to a substantially uniform magnetic field such that interaction between the ferrofluid and the electrically-conductive particles causes the electrically-conductive particles to form a regular pattern of particles each in contact with an adjacent particle with a conductor of one or both sets of conductors or with both a particle and one or two conductors; and activating the latent adhesive property of the particles with a latent adhesive property whereby conductive pathways are provided from one set of conductors to the other set, each pathway comprising one or more of the electrically-conductive particles, and the conductors are bonded by the particles.

15. A method according to claim 14 which includes applying pressure to urge the respective sets of conductors towards one another before and/or during activation of the latent adhesive property.

16. A method according to claim 15 wherein the separation between the respective sets of conductors at the time of activation of the latent adhesive property is substantially equal to or less than the average diameter of the electrically-conductive particles.

17. A method according to claim 14 wherein the magnetic field is applied normal to the layer of the composition and the electrically conductive particles form a regular array of particles in a monolayer.

18. A method according to claim 14 wherein the magnetic field is applied parallel to the layer of adhesive composition and the electrically-conductive particles form parallel chains of particles, each in electrical contact with an adjacent particle or particles of the same chain.

19. A method according to claim 14 wherein the electrically-conductive particles are solder particles of an electro-conductive metal alloy.

20. A method according to claim 19 wherein the non-magnetic carrier liquid is a rosin-based flux.

21. A method according to claim 20 which includes the further step of:

applying a sealant or encapsulating composition over the ferrofluid composition and curing the sealant or encapsulating composition to seal the ferrofluid composition in place.

22. A method according to claim 20 which includes the further step of:

retracting the ferrofluid liquid from between the conductors and injecting an adhesive, sealant or encapsulating composition between the conductors.

23. A method according to claim 14 wherein the separation between the respective sets of conductors at the time of activation of the latent adhesive property is substantially equal to or less than the average diameter of the electrically-conductive particles.

24. A composition comprising:

(i) a plurality of electrically-conductive particles having substantially uniform sizes and shapes dispersed in either:

(ii) a ferrofluid comprising a colloidal suspension of ferromagnetic particles in a curable, non-magnetic carrier liquid, or (iii) a mixture of a ferrofluid comprising a colloidal suspension of ferromagnetic particles in a curable or non-curable, non-magnetic carrier liquid with a curable liquid composition.

25. A composition according to claim 24 wherein the average particle size of the electrically-conductive particles is at least 10 times that of the colloidal ferromagnetic particles.

26. A composition according to claim 24 wherein the electrically-conductive particles are substantially non-magnetic.

27. A composition according to claim 26 wherein the electrically-conductive particles comprise a non-magnetic, non-conductive core coated with an electrically-conductive metal.

28. A composition according to claim 27 wherein the core is selected from plastics material and glass and optionally is hollow.

29. A composition according to claim 24 wherein the non-magnetic carrier liquid is curable and the composition is a curable composition.

30. A composition according to claim 29 wherein the curable composition is an adhesive composition.

31. A composition according to claim 30 wherein the ferrofluid is a dispersion of colloidal magnetic particles in a curable liquid adhesive composition.

32. A composition according to claim 24 wherein the electrically-conductive particles have a latent adhesive property.

33. A composition according to claim 32 wherein the latent adhesive property is activated by heat.

34. A composition according to claim 33 wherein the electrically-conductive particles comprise a fusible metal.

35. A composition according to claim 34 wherein the fusible metal comprises solder particles of an electroconductive metal alloy.

36. A composition according to claim 33 wherein the conductive particles comprise particles which are of conductive material or which have a conductive coating thereon, and which bear an outer coating of an adhesive which is activatable by heat or pressure.

37. A composition according to claim 24 wherein the electrically-conductive particles comprise a fusible metal.

38. A composition according to claim 37 wherein the fusible metal comprises solder particles of an electroconductive metal alloy.

39. A composition according to claim 24 wherein the conductive particles comprise particles which are of conductive material or which have a conductive coating thereon, and which bear an outer coating of an adhesive which is activatable by heat or pressure.

40. A composition comprising a plurality of electrically-conductive particles having substantially uniform sizes and shapes dispersed in a ferrofluid comprising a colloidal suspension of ferromagnetic particles in a non-curable, non-magnetic carrier liquid wherein the electrically-conductive particles comprise an outer coating of an adhesive which is activatable by heat or pressure.

* * * * *

UNITED STATES PATENT AND TRADEMARK OFFICE
CERTIFICATE OF CORRECTION

PATENT NO. : 5,769,996
DATED : June 23, 1998
INVENTOR(S) : McArdle, et al.

It is certified that error appears in the above-indentified patent and that said Letters Patent is hereby corrected as shown below:

In Column 21, Line 5.    delete   "105 micrometres$^2$", and insert therefor-- $10^5$ micrometers$^2$--.

Signed and Sealed this

Sixth Day of June, 2000

*Attest:*

Q. TODD DICKINSON

*Attesting Officer*         *Director of Patents and Trademarks*